United States Patent
Nakajima (12)

(10) Patent No.: US 6,232,612 B1
(45) Date of Patent: May 15, 2001

(54) VARIABLE SHAPED ELECTRON BEAM EXPOSURE SYSTEM AND METHOD OF WRITING A PATTERN BY A VARIABLE SHAPED ELECTRON BEAM

(75) Inventor: Ken Nakajima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/118,086

(22) Filed: Jul. 17, 1998

(30) Foreign Application Priority Data

Jul. 18, 1997 (JP) .................................................. 9-193851

(51) Int. Cl.[7] .................................................. H01J 37/304
(52) U.S. Cl. .................................. 250/492.23; 250/492.22
(58) Field of Search ........................ 250/492.22, 492.23, 250/492.2, 505.1

(56) References Cited

U.S. PATENT DOCUMENTS 5,886,357 * 3/1999 Kojima ............................ 250/492.23
6,121,625 * 9/2000 Ito et al. .......................... 250/492.22

FOREIGN PATENT DOCUMENTS 536594    2/1993  (JP) .
5-90144   4/1993  (JP) .
5-198483  8/1993  (JP) .

* cited by examiner

Primary Examiner—Kiet T. Nguyen
(74) Attorney, Agent, or Firm—Young & Thompson

(57) ABSTRACT

An aperture member in a variable shaped electron beam exposure system to be used in combination with a counterpart aperture member is provided for a variable shaped electron beam exposure. The counterpart aperture member has a first aperture and the aperture member has a second aperture for shaping an electron beam, wherein the aperture member further has at least one aperture mask pattern having a shape different from a shape of the second aperture and the at least one aperture mask pattern has a smaller size than the first aperture so that the electron beam is shaped in accordance with the shape of the at least one aperture mask pattern except when the electron beam is shaped by a combination of the first and second apertures for the variable shaped electron beam exposure.

28 Claims, 11 Drawing Sheets

FIG. 1A  prior art
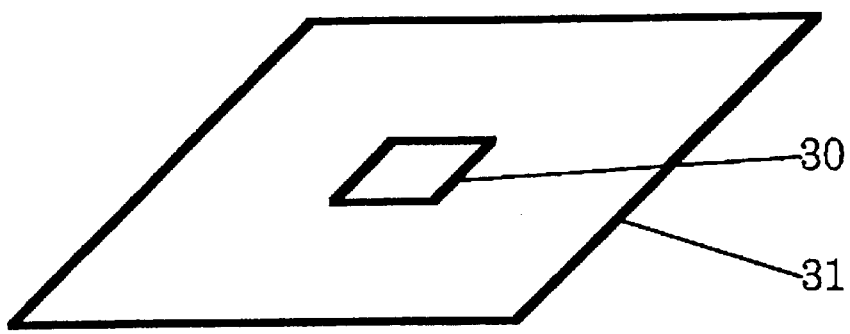
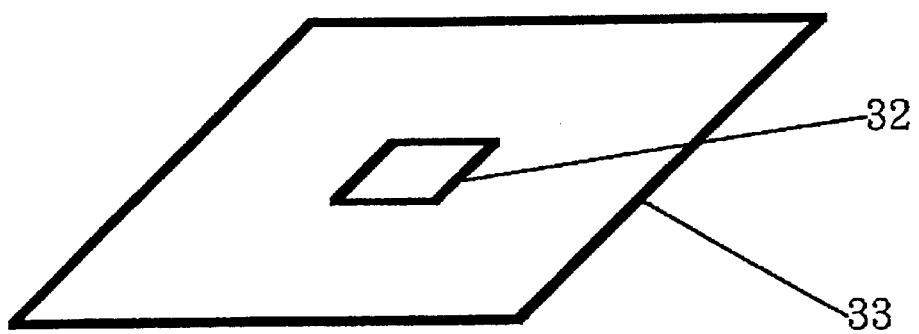

VARIABLE SHAPED ELECTRON BEAM EXPOSURE SYSTEM AND METHOD OF WRITING A PATTERN BY A VARIABLE SHAPED ELECTRON BEAM

BACKGROUND OF THE INVENTION

The present invention relates to a variable shaped electron beam exposure system, and a method of writing a pattern on a resist with a variable shaped electron beam exposure as well as a storage medium having stored a computer program for execution of a variable shaped electron beam exposure to write any patterns on the resist, and more particularly to a variable shaped electron beam exposure system suitable for forming application specific integrated circuits (ASICs) with less regularly repeated patterns or for logic devices of microcomputers, and a method of writing a pattern on a resist with a variable shaped electron beam exposure for forming the same as well as a storage medium having stored a computer program for execution of a variable shaped electron beam exposure to write any patterns on the resist.

The electron beam exposure methods are classified into two typical types. The first one is one-shot electron beam exposure in projection mode using a mask. The second one is a variable shaped electron beam exposure without use of any mask.

The one-shot electron beam exposure systems operable in projection mode using the mask are disclosed in Japanese laid-open patent publications Nos. 6-140305 and 7-56318. An electron beam is emitted from an electron gun for projecting a pattern image of a mask through a projection system onto a resist over a wafer. This method is suitable for writing regularly repeated patterns on the resist over the wafer, for example, in order to form dynamic random access memory devices and static random access memory devices.

In the meantime, the variable shaped electron beam exposure method is suitable for random patterns with less regularly repeated patterns, for example, in order to form the application specific integrated circuits (ASIC) and the logic devices of the microcomputer.

FIG. 1A is a view illustrative of first and second aperture plates with first and second apertures used in a conventional variable shaped electron beam exposure system. The conventional variable shaped electron beam exposure system has a first aperture plate 31 with a first aperture 30 which is rectangular-shaped and a second aperture plate 33 with a second aperture 32 which is also rectangular-shaped, so that the electron beam emitted from the electron gun is firstly defined by the first aperture 30 and then deflected by a deflector not illustrated for subsequent second definition of the electron beam by the second aperture 33. The electron beam shaped by the first and second apertures 30 and 32 are transmitted to the resist over the wafer. By controlling or adjusting the deflection of the electron beam by the deflector, the shape of the electron beam having penetrated through the first and second apertures 30 and 32 are varied.

FIG. 1B is a plane view illustrative of first and second apertures of the conventional variable shaped electron beam exposure system. The first and second aperture plates 31 and 33 are placed to have a distance in a direction along which the electron beam is transmitted. The first and second aperture plates 31 and 33 are also placed to be relatively displaced from each other on a plane vertical to the direction along which the electron beam is transmitted, so that, in the plane view, the fist and second apertures 30 and 32 are partially overlapped to have a rectangular-shaped overlap area 34 through which the electron beam is transmitted. Namely, the electron beam having penetrated through both the first and second apertures 30 and 32 are defined to have the same shape as the rectangular-shaped overlap area 34. As a result, the resist over the wafer is exposed to the rectangular-shaped electron beam having been shaped by the first and second apertures 30 and 32.

FIG. 1C is a plane view illustrative of completely overlapping first and second apertures of the conventional variable shaped electron beam exposure system. The first and second apertures completely overlap to have a maximum overlap area 35 with the same shape as the first and second apertures 30 and 32. The maximum overlap area 35 may be considered to be a maximum electron beam exposure area which means the maximum area of a single time variable shaped electron beam exposure. This means it necessary to divide each of the required patterns with optional shapes into plural rectangular-shaped unit patterns which are, however, smaller in size than the maximum electron beam exposure area so that the variable shaped electron beam exposures are sequentially conducted to sequentially write the divided rectangular shaped unit patterns. FIG. 2 is a plane view illustrative of one of required patterns, each of which is divided into unit patterns by separation lines 36. Six required patterns with different shapes are individually divided by the separation lines 36 into thirty three rectangular-shaped unit patterns which are smaller in size than the maximum electron beam exposure area. The electron beam is variably shaped by adjusting the overlapping area of the first and second apertures 30 and 32 so that the electron beam has the same shape as the rectangular shaped unit pattern.

In recent years, it has been required to shorten the necessary time for the electron beam lithography process as the variation of the logic devices has been increased and the production in a small scale has been required.

However, the required patterns with different shapes are individually divided into many rectangular-shaped unit patterns which are smaller in size than the maximum electron beam exposure area for sequential exposures for every the rectangular-shaped unit patterns. This means it difficult to shorten the necessary time for the electron beam lithography process, resulting in a drop of the throughput.

If further the required pattern has a complicated shape, then such the pattern is divided into may fine rectangular shaped unit patterns. This may raise an issue of increased variation in size of the required pattern, whereby the accuracy in writing the pattern is dropped.

In the above circumstances, it had been required to develop a novel variable shaped electron beam exposure system and a method of writing a pattern on a resist with a variable shaped electron beam exposure free from the above problems and disadvantages, as well as a storage medium having stored a computer program for execution of a variable shaped electron beam exposure to write any patterns on the resist.

SUMMARY OF THE INVENTION

Accordingly, it is an object of the present invention to provide a novel variable shaped electron beam exposure system free from the above problems.

It is a further object of the present invention to provide a novel variable shaped electron beam exposure system which allows shortening the necessary time for an electron beam lithography process.

It is a still further object of the present invention to provide a novel variable shaped electron beam exposure system which allows obtaining a high throughput.

It is yet a further object of the present invention to provide a novel variable shaped electron beam exposure system capable of writing any complicatedly shaped patterns with a minimum variation in size.

It is a further more object of the present invention to provide a novel variable shaped electron beam exposure system capable of writing any complicatedly shaped patterns with a high accuracy in size.

It is still more object of the present invention to provide a novel method of writing a pattern on a resist with a variable shaped electron beam exposure free from the above problems.

It is moreover object of the present invention to provide a novel method of writing a pattern on a resist with a variable shaped electron beam exposure, which allows shortening the necessary time for an electron beam lithography process.

It is another object of the present invention to provide a novel method of writing a pattern on a resist with a variable shaped electron beam exposure, which allows obtaining a high throughput.

It is still another object of the present invention to provide a novel method of writing a pattern on a resist with a variable shaped electron beam exposure for writing any complicatedly shaped patterns with a minimum variation in size.

It is yet another object of the present invention to provide a novel method of writing a pattern on a resist with a variable shaped electron beam exposure for writing any complicatedly shaped patterns with a high accuracy in size.

It is further another object of the present invention to provide a storage medium having stored a computer program for execution of a variable shaped electron beam exposure to write any patterns on the resist free from the above problems.

It is an additional object of the present invention to provide a storage medium having stored a computer program for execution of a variable shaped electron beam exposure to write any patterns on the resist for shortening the necessary time for an electron beam lithography process.

It is a still additional object of the present invention to provide a storage medium having stored a computer program for execution of a variable shaped electron beam exposure to write any patterns on the resist for obtaining a high throughput.

It is yet an additional object of the present invention to provide a storage medium having stored a computer program for execution of a variable shaped electron beam exposure to write any patterns on the resist for writing any complicatedly shaped patterns with a minimum variation in size.

It is a further additional object of the present invention to provide a storage medium having stored a computer program for execution of a variable shaped electron beam exposure to write any patterns on the resist for writing any complicatedly shaped patterns with a high accuracy in size.

The present invention provides an aperture member in a variable shaped electron beam exposure system. The aperture member is to be used in combination with a counterpart aperture member for a variable shaped electron beam exposure. The counterpart aperture member has a first aperture and the aperture member has a second aperture for shaping an electron beam, wherein the aperture member further has at least one aperture mask pattern having a shape different from a shape of the second aperture and the at least one aperture mask pattern has a smaller size than the first aperture so that the electron beam is shaped in accordance with the shape of the at least one aperture mask pattern except when the electron beam is shaped by a combination of the first and second apertures for the variable shaped electron beam exposure.

It is preferable that the counterpart aperture member is used as a first aperture member and the aperture member is used as a second aperture member so that the electron beam has been transmitted through the counterpart aperture member before the electron beam is subsequently transmitted through the aperture member. Each of write-required patterns is divided into a plurality of unit patterns in order to collate the unit patterns with the shape of the at least one aperture mask pattern so as to confirm any correspondence between the unit patterns and the shape of the at least one aperture mask pattern, so that if the correspondence between the unit patterns and the shape of the at least one aperture mask pattern is confirmed, then a deflection of the electron beam by a deflector is controlled to allow the electron beam to be transmitted toward the at least one aperture mask pattern of the aperture member whereby the electron beam is shaped in accordance with the shape of the at least one aperture mask pattern, and so that if, however, no correspondence between the unit patterns and the shape of the at least one aperture mask pattern is confirmed, then the deflection is controlled to allow the electron beam to be transmitted toward the second aperture whereby the electron beam is shaped by a combination of the first and second apertures for the variable shaped electron beam exposure.

It is preferable that the aperture member has a set of plural aperture mask patterns differing in shape from each other. The unit patterns are collated with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the deflection is controlled to allow the electron beam to be transmitted toward a corresponding one of the plural aperture mask patterns of the second aperture member whereby the electron beam is shaped in accordance with the shape of the corresponding one of the plural aperture mask patterns, and so that if no correspondence between the unit patterns and any of the shapes of the plural aperture mask patterns is confirmed, then the deflection is controlled to allow the electron beam to be transmitted toward the second aperture whereby the electron beam is shaped by a combination of the first and second apertures for the variable shaped electron beam exposure.

It is preferable that the second aperture is positioned at a center of the aperture member and the plural aperture mask patterns are positioned around the second aperture.

It is preferable that the aperture member is used as a first aperture member and the counterpart aperture member is used as a second aperture member so that the electron beam has been transmitted through the aperture member before the electron beam is subsequently transmitted through the counterpart aperture member. Each of write-required patterns is divided into a plurality of unit patterns in order to collate the unit patterns with the shape of the at least one aperture mask pattern to confirm any correspondence between the unit patterns and the shape of the at least one aperture mask pattern, so that if the correspondence between the unit patterns and the shape of the at least one aperture mask pattern is confirmed, then a deflection of the electron beam by a deflector is controlled to allow that the electron beam penetrated through and shaped by the at least one aperture mask pattern is passed through the second aperture whereby the electron beam is shaped in accordance with the shape of the at least one aperture mask pattern, and so that if no correspondence between the unit patterns and the shape of the at least one aperture mask pattern is confirmed, then the deflection is controlled to allow that the electron beam penetrated through and shaped by the first aperture is transmitted toward the second aperture whereby the electron beam is shaped by a combination of the first and second apertures for the variable shaped electron beam exposure.

It is preferable that the aperture member has a set of plural aperture mask patterns differing in shape from each other. The unit patterns are collated with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the deflection is controlled to allow that the electron beam penetrated through and shaped by a corresponding one of the plural aperture mask patterns is passed through the second aperture whereby the electron beam is shaped in accordance with the shape of the corresponding one of the plural aperture mask patterns, and so that if no correspondence between the unit patterns and any of the shapes of the plural aperture mask patterns is confirmed, then the deflection is controlled to allow that the electron beam penetrated through and shaped by the first aperture is passed through the second aperture whereby the electron beam is shaped by a combination of the first and second apertures for the variable shaped electron beam exposure.

It is preferable that the second aperture is positioned at a center of the aperture member and the plural aperture mask patterns are positioned around the second aperture.

In accordance with the above present invention, any of the plural aperture mask patterns is optionally and effectively used for the variable shaped electron beam exposure. For this reason, a total number of the unit patterns divided from the write-required patterns is remarkably reduced as compared to the prior art. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIG. 1A is a view illustrative of first and second aperture plates with first and second apertures used in the conventional variable shaped electron beam exposure system.

DISCLOSURE OF THE INVENTION

Figure 1B:
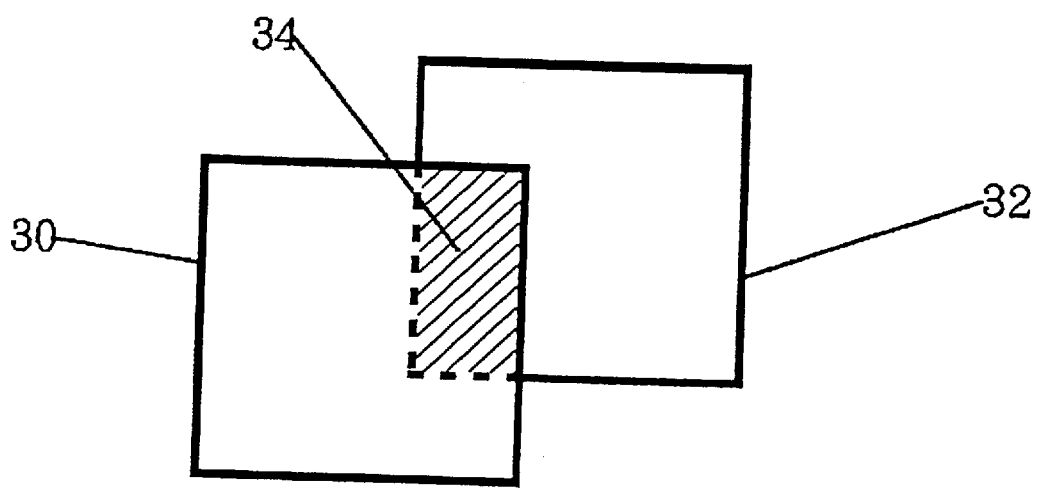
FIG. 1B is a plane view illustrative of first and second apertures of the conventional variable shaped electron beam exposure system.
Figure 1C:
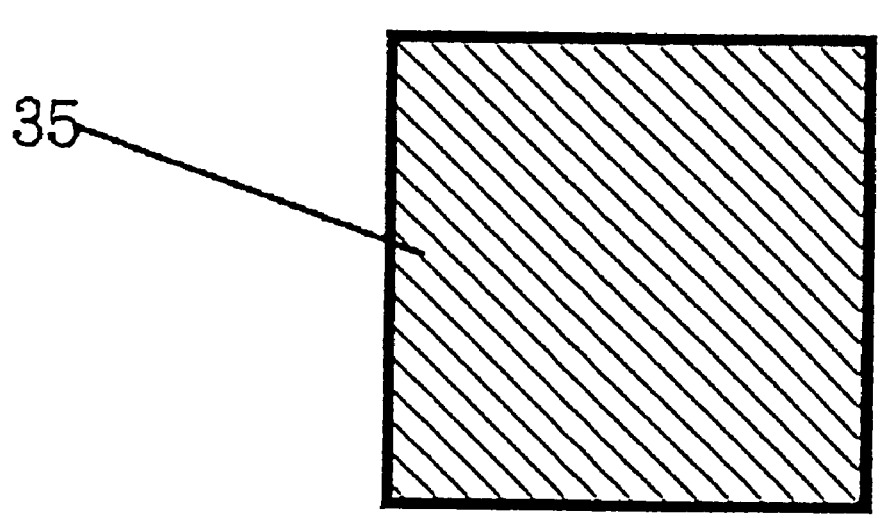
FIG. 1C is a plane view illustrative of completely overlapping first and second apertures of the conventional variable shaped electron beam exposure system.
Figure 2:
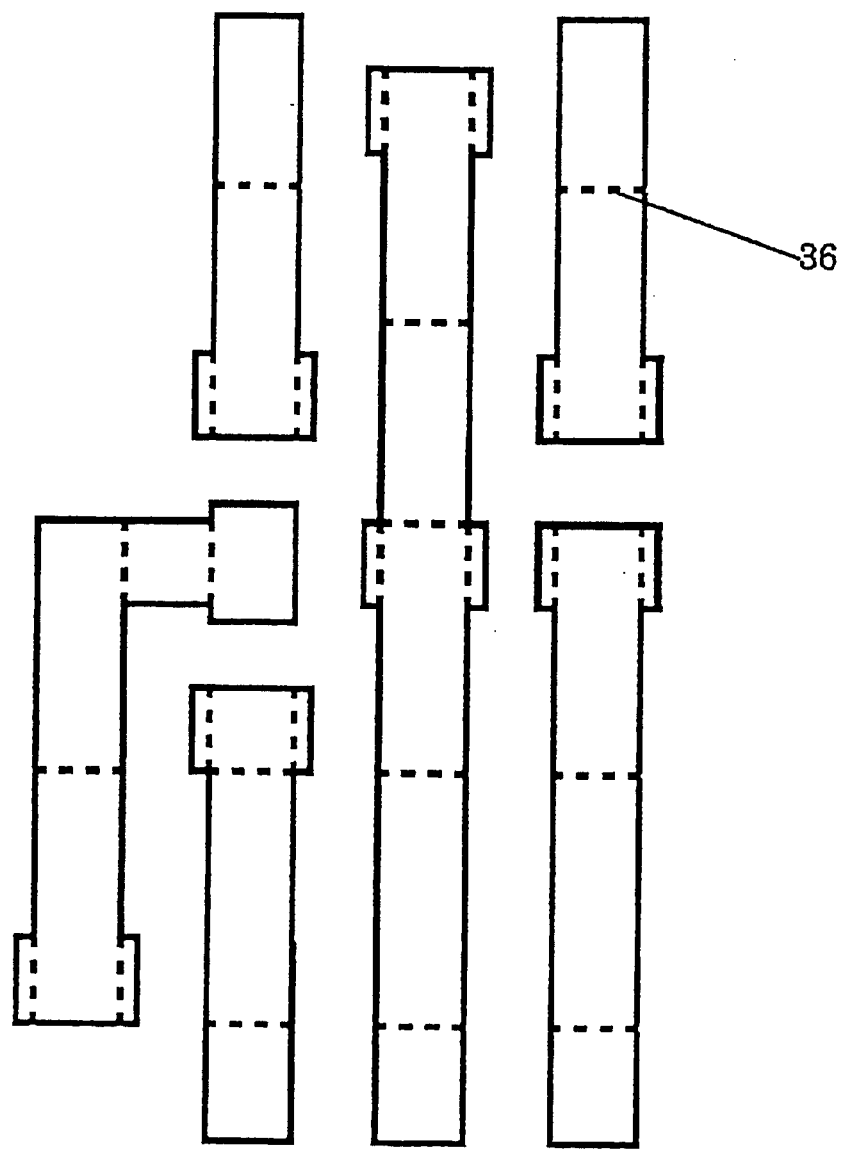
FIG. 2 is a plane view illustrative of write-required patterns, each of which is divided into unit patterns by separation lines to explain a conventional variable shaped electron beam exposure method.

The first present invention provides an aperture member in a variable shaped electron beam exposure system. The aperture member is to be used in combination with a counterpart aperture member for a variable shaped electron beam exposure. The counterpart aperture member has a first aperture and the aperture member has a second aperture for shaping an electron beam, wherein the aperture member further has at least one aperture mask pattern having a shape different from a shape of the second aperture and the at least one aperture mask pattern has a smaller size than the first aperture so that the electron beam is shaped in accordance with the shape of the at least one aperture mask pattern except when the electron beam is shaped by a combination of the first and second apertures for the variable shaped electron beam exposure.

It is preferable that the counterpart aperture member is used as a first aperture member and the aperture member is used as a second aperture member so that the electron beam has been transmitted through the counterpart aperture member before the electron beam is subsequently transmitted through the aperture member. Each of write-required patterns is divided into a plurality of unit patterns in order to collate the unit patterns with the shape of the at least one aperture mask pattern so as to confirm any correspondence between the unit patterns and the shape of the at least one aperture mask pattern, so that if the correspondence between the unit patterns and the shape of the at least one aperture mask pattern is confirmed, then a deflection of the electron beam by a deflector is controlled to allow the electron beam to be transmitted toward the at least one aperture mask pattern of the aperture member whereby the electron beam is shaped in accordance with the shape of the at least one aperture mask pattern, and so that if, however, no correspondence between the unit patterns and the shape of the at least one aperture mask pattern is confirmed, then the deflection is controlled to allow the electron beam to be transmitted toward the second aperture whereby the electron beam is shaped by a combination of the first and second apertures for the variable shaped electron beam exposure.

It is preferable that the aperture member has a set of plural aperture mask patterns differing in shape from each other. The unit patterns are collated with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the deflection is controlled to allow the electron beam to be transmitted toward a corresponding one of the plural aperture mask patterns of the second aperture member whereby the electron beam is shaped in accordance with the shape of the corresponding one of the plural aperture mask patterns, and so that if no correspondence between the unit patterns and any of the shapes of the plural aperture mask patterns is confirmed, then the deflection is controlled to allow the electron beam to be transmitted toward the second aperture whereby the electron beam is shaped by a combination of the first and second apertures for the variable shaped electron beam exposure.

It is preferable that the second aperture is positioned at a center of the aperture member and the plural aperture mask patterns are positioned around the second aperture.

It is preferable that the aperture member is used as a first aperture member and the counterpart aperture member is used as a second aperture member so that the electron beam has been transmitted through the aperture member before the electron beam is subsequently transmitted through the counterpart aperture member. Each of write-required patterns is divided into a plurality of unit patterns in order to collate the unit patterns with the shape of the at least one aperture mask pattern to confirm any correspondence between the unit patterns and the shape of the at least one aperture mask pattern, so that if the correspondence between the unit patterns and the shape of the at least one aperture mask pattern is confirmed, then a deflection of the electron beam by a deflector is controlled to allow that the electron beam penetrated through and shaped by the at least one aperture mask pattern is passed through the second aperture whereby the electron beam is shaped in accordance with the shape of the at least one aperture mask pattern, and so that if no correspondence between the unit patterns and the shape of the at least one aperture mask pattern is confirmed, then the deflection is controlled to allow that the electron beam penetrated through and shaped by the first aperture is transmitted toward the second aperture whereby the electron beam is shaped by a combination of the first and second apertures for the variable shaped electron beam exposure.

It is preferable that the aperture member has a set of plural aperture mask patterns differing in shape from each other. The unit patterns are collated with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the deflection is controlled to allow that the electron beam penetrated through and shaped by a corresponding one of the plural aperture mask patterns is passed through the second aperture whereby the electron beam is shaped in accordance with the shape of the corresponding one of the plural aperture mask patterns, and so that if no correspondence between the unit patterns and any of the shapes of the plural aperture mask patterns is confirmed, then the deflection is controlled to allow that the electron beam penetrated through and shaped by the first aperture is passed through the second aperture whereby the electron beam is shaped by a combination of the first and second apertures for the variable shaped electron beam exposure.

It is preferable that the second aperture is positioned at a center of the aperture member and the plural aperture mask patterns are positioned around the second aperture.

In accordance with the above first present invention, any of the plural aperture mask patterns is optionally and effectively used for the variable shaped electron beam exposure. For this reason, a total number of the unit patterns divided from the write-required patterns is remarkably reduced as compared to the prior art. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

The second present invention provides an electron beam shaping section in a variable shaped electron beam exposure system. The electron beam shaping section comprises the following elements. A pair of first and second aperture members is positioned to have a distance in a direction along which an electron beam is transmitted. The first and second aperture members have first and second apertures for shaping the electron beam so that the electron beam is first transmitted through the first aperture member and then transmitted through the second aperture member. A deflector is positioned between the first and second aperture members for deflecting the electron beam. The second aperture member further has at least one aperture mask pattern having a shape different from a shape of the second aperture and the at least one aperture mask pattern has a smaller size than the first aperture so that the electron beam is shaped in accordance with the shape of the at least one aperture mask pattern except when the electron beam is shaped by a combination of the first and second apertures for the variable shaped electron beam exposure. Each of write-required patterns is divided into a plurality of unit patterns in order to collate the unit patterns with the shape of the at least one aperture mask pattern so as to confirm any correspondence between the unit patterns and the shape of the at least one aperture mask pattern, so that if the correspondence between the unit patterns and the shape of the at least one aperture mask pattern is confirmed, then a deflection of the electron beam by a deflector is controlled to allow the electron beam to be transmitted toward the at least one aperture mask pattern of the second aperture member whereby the electron beam is shaped in accordance with the shape of the at least one aperture mask pattern, and so that if, however, no correspondence between the unit patterns and the shape of the at least one aperture mask pattern is confirmed, then the deflection is controlled to allow the electron beam to be transmitted toward the second aperture whereby the electron beam is shaped by a combination of the first and second apertures for the variable shaped electron beam exposure.

It is preferable that the second aperture member has a set of plural aperture mask patterns differing in shape from each other. The unit patterns are collated with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the deflection is controlled to allow the electron beam to be transmitted toward a corresponding one of the plural aperture mask patterns of the second aperture member whereby the electron beam is shaped in accordance with the shape of the corresponding one of the plural aperture mask patterns, and so that if no correspondence between the unit patterns and any of the shapes of the plural aperture mask patterns is confirmed, then the deflection is controlled to allow the electron beam to be transmitted toward the second aperture whereby the electron beam is shaped by a combination of the first and second apertures for the variable shaped electron beam exposure. It is preferable that the second aperture is positioned at a center of the second aperture member and the plural aperture mask patterns are positioned around the second aperture.

In accordance with the above second present invention, any of the plural aperture mask patterns is optionally and effectively used for the variable shaped electron beam exposure. For this reason, a total number of the unit patterns divided from the write-required patterns is remarkably reduced as compared to the prior art. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

The third present invention provides an electron beam shaping section in a variable shaped electron beam exposure system. The electron beam shaping section comprises the following elements. A pair of first and second aperture members is positioned to have a distance in a direction along which an electron beam is transmitted. The first and second aperture members have first and second apertures for shaping the electron beam so that the electron beam is first transmitted through the first aperture member and then transmitted through the second aperture member. A deflector is positioned between the first and second aperture members for deflecting the electron beam. The first aperture member further has at least one aperture mask pattern having a shape different from a shape of the first aperture and the at least one aperture mask pattern has a smaller size than the second aperture so that the electron beam is shaped in accordance with the shape of the at least one aperture mask pattern except when the electron beam is shaped by a combination of the first and second apertures for the variable shaped electron beam exposure. Each of write-required patterns is divided into a plurality of unit patterns in order to collate the unit patterns with the shape of the at least one aperture mask pattern to confirm any correspondence between the unit patterns and the shape of the at least one aperture mask pattern, so that if the correspondence between the unit patterns and the shape of the at least one aperture mask pattern is confirmed, then a deflection of the electron beam by a deflector is controlled to allow that the electron beam penetrated through and shaped by the at least one aperture mask pattern is passed through the second aperture whereby the electron beam is shaped in accordance with the shape of the at least one aperture mask pattern, and so that if no correspondence between the unit patterns and the shape of the at least one aperture mask pattern is confirmed, then the deflection is controlled to allow that the electron beam penetrated through and shaped by the first aperture is transmitted toward the second aperture whereby the electron beam is shaped by a combination of the first and second apertures for the variable shaped electron beam exposure.

It is preferable that the first aperture member has a set of plural aperture mask patterns differing in shape from each other. The unit patterns are collated with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the deflection is controlled to allow that the electron beam penetrated through and shaped by a corresponding one of the plural aperture mask patterns is passed through the second aperture whereby the electron beam is shaped in accordance with the shape of the corresponding one of the plural aperture mask patterns, and so that if no correspondence between the unit patterns and any of the shapes of the plural aperture mask patterns is confirmed, then the deflection is controlled to allow that the electron beam penetrated through and shaped by the first aperture is passed through the second aperture whereby the electron beam is shaped by a combination of the first and second apertures for the variable shaped electron beam exposure.

It is preferable that the first aperture is positioned at a center of the first aperture member and the plural aperture mask patterns are positioned around the first aperture.

In accordance with the above third present invention, any of the plural aperture mask patterns is optionally and effectively used for the variable shaped electron beam exposure. For this reason, a total number of the unit patterns divided from the write-required patterns is remarkably reduced as compared to the prior art. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

The fourth present invention provides a controller in a variable shaped electron beam exposure system. The controller is connected to a deflector for controlling a deflection by the deflector to an electron beam on a transmission between first and second aperture members positioned to have a distance along which the electron beam is transmitted. The first and second aperture members have first and second apertures for shaping the electron beam so that the electron beam is first transmitted through the first aperture member and then transmitted through the second aperture member. The second aperture member further has at least one aperture mask pattern with a shape different from a shape of the second aperture and the at least one aperture mask pattern also has a smaller size than the first aperture. The controller includes: a first section being connected to a first memory for reading data of write-required patterns out of the first memory to divide each of the write-required patterns into a plurality of unit patterns; and a second section being connected to the first section for fetching the unit patterns and also connected to a second memory for reading out data of the shape of the at least one aperture mask pattern so as to collate the unit patterns with the shape of the at least one aperture mask pattern to confirm any correspondence between the unit patterns and the shape of the at least one aperture mask pattern, so that if the correspondence between the unit patterns and the shape of the at least one aperture mask pattern is confirmed, then the controller controls the deflection to allow the electron beam to be transmitted toward the at least one aperture mask pattern of the second aperture member whereby the electron beam is shaped in accordance with the shape of the at least one aperture mask pattern, and so that if, however, no correspondence between the unit patterns and the shape of the at least one aperture mask pattern is confirmed, then the controller controls the deflection to allow the electron beam to be transmitted toward the second aperture whereby the electron beam is shaped by a combination of the first and second apertures for the variable shaped electron beam exposure.

It is preferable that the second aperture member has a set of plural aperture mask patterns differing in shape from each other, and the second section collates the unit patterns with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the controller controls the deflection to allow the electron beam to be transmitted toward a corresponding one of the plural aperture mask patterns of the second aperture member whereby the electron beam is shaped in accordance with the shape of the corresponding one of the plural aperture mask patterns, and so that if no correspondence between the unit patterns and any of the shapes of the plural aperture mask patterns is confirmed, then the controller controls the deflection to allow the electron beam to be transmitted toward the second aperture whereby the electron beam is shaped by a combination of the first and second apertures for the variable shaped electron beam exposure.

It is preferable that the second aperture is positioned at a center of the second aperture member and the plural aperture mask patterns are positioned around the second aperture.

In accordance with the above fourth present invention, any of the plural aperture mask patterns is optionally and effectively used for the variable shaped electron beam exposure. For this reason, a total number of the unit patterns divided from the write-required patterns is remarkably reduced as compared to the prior art. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

The fifth present invention provides a controller in a variable shaped electron beam exposure system. The controller is connected to a deflector for controlling a deflection by the deflector to an electron beam on a transmission between first and second aperture members positioned to have a distance along which the electron beam is transmitted. The first and second aperture members have first and second apertures for shaping the electron beam so that the electron beam is first transmitted through the first aperture member and then transmitted through the second aperture member. The first aperture member further has at least one aperture mask pattern with a shape different from a shape of the first aperture and the at least one aperture mask pattern also has a smaller size than the second aperture. The controller includes: a first section being connected to a first memory for reading data of write-required patterns out of the first memory to divide each of the write-required patterns into a plurality of unit patterns; and a second section being connected to the first section for fetching the unit patterns and also connected to a second memory for reading out data of the shape of the at least one aperture mask pattern so as to collate the unit patterns with the shape of the at least one aperture mask pattern to confirm any correspondence between the unit patterns and the shape of the at least one aperture mask pattern, so that if the correspondence between the unit patterns and the shape of the at least one aperture mask pattern is confirmed, then the controller controls the deflection to allow that the electron beam penetrated through and shaped by the at least one aperture mask pattern is passed through the second aperture whereby the electron beam is shaped in accordance with the shape of the at least one aperture mask pattern, and so that if no correspondence between the unit patterns and the shape of the at least one aperture mask pattern is confirmed, then the controller controls the deflection to allow that the electron beam penetrated through and shaped by the first aperture is transmitted toward the second aperture whereby the electron beam is shaped by a combination of the first and second apertures for the variable shaped electron beam exposure.

It is preferable that the first aperture member has a set of plural aperture mask patterns differing in shape from each other, and the second section collates the unit patterns with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the controller controls the deflection to allow that the electron beam penetrated through and shaped by a corresponding one of the plural aperture mask patterns is passed through the second aperture whereby the electron beam is shaped in accordance with the shape of the corresponding one of the plural aperture mask patterns, and so that if no correspondence between the unit patterns and any of the shapes of the plural aperture mask patterns is confirmed, then the controller controls the deflection to allow that the electron beam penetrated through and shaped by the first aperture is passed through the second aperture whereby the electron beam is shaped by a combination of the first and second apertures for the variable shaped electron beam exposure.

It is preferable that the first aperture is positioned at a center of the first aperture member and the plural aperture mask patterns are positioned around the first aperture.

In accordance with the above fifth present invention, any of the plural aperture mask patterns is optionally and effectively used for the variable shaped electron beam exposure. For this reason, a total number of the unit patterns divided from the write-required patterns is remarkably reduced as compared to the prior art. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

The sixth present invention provides a variable shaped electron beam exposure system comprising the following elements. An electron gum is provided for emitting an electron beam. A pair of first and second aperture members is positioned to have a distance in a direction along which the electron beam is transmitted. The first and second aperture members have first and second apertures for shaping the electron beam so that the electron beam is first transmitted through the first aperture member and then transmitted through the second aperture member. The second aperture member further has at least one aperture mask pattern having a shape different from a shape of the second aperture and the at least one aperture mask pattern has a smaller size than the first aperture. A deflector is positioned between the first and second aperture members for deflecting the electron beam. A controller is connected to a deflector for controlling a deflection by the deflector to the electron beam on a transmission between first and second aperture members. The controller further includes: a first section being connected to a first memory for reading data of write-required patterns out of the first memory to divide each of the write-required patterns into a plurality of unit patterns; and a second section being connected to the first section for fetching the unit patterns and also connected to a second memory for reading out data of the shape of the at least one aperture mask pattern so as to collate the unit patterns with the shape of the at least one aperture mask pattern to confirm any correspondence between the unit patterns and the shape of the at least one aperture mask pattern, so that if the correspondence between the unit patterns and the shape of the at least one aperture mask pattern is confirmed, then the controller controls the deflection to allow the electron beam to be transmitted toward the at least one aperture mask pattern of the second aperture member whereby the electron beam is shaped in accordance with the shape of the at least one aperture mask pattern, and so that if no correspondence between the unit patterns and the shape of the at least one aperture mask pattern is confirmed, then the controller controls the deflection to allow the electron beam to be transmitted toward the second aperture whereby the electron beam is shaped by a combination of the first and second apertures for the variable shaped electron beam exposure, It is preferable that the second aperture member has a set of plural aperture mask patterns differing in shape from each other, and the second section collates the unit patterns with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the controller controls the deflection to allow the electron beam to be transmitted toward a corresponding one of the plural aperture mask patterns of the second aperture member whereby the electron beam is shaped in accordance with the shape of the corresponding one of the plural aperture mask patterns, and so that if no correspondence between the unit patterns and any of the shapes of the plural aperture mask patterns is confirmed, then the controller controls the deflection to allow the electron beam to be transmitted toward the second aperture whereby the electron beam is shaped by a combination of the first and second apertures for the variable shaped electron beam exposure.

It is preferable that the second aperture is positioned at a center of the second aperture member and the plural aperture mask patterns are positioned around the second aperture.

In accordance with the above sixth present invention, any of the plural aperture mask patterns is optionally and effectively used for the variable shaped electron beam exposure. For this reason, a total number of the unit patterns divided from the write-required patterns is remarkably reduced as compared to the prior art. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

The seventh present invention provides a variable shaped electron beam exposure system comprising the following elements. An electron gum is provided for emitting an electron beam. A pair of first and second aperture members is positioned to have a distance in a direction along which an electron beam is transmitted. The first and second aperture members have first and second apertures for shaping the electron beam so that the electron beam is first transmitted through the first aperture member and then transmitted through the second aperture member. The first aperture member further has at least one aperture mask pattern having a shape different from a shape of the first aperture and the at least one aperture mask pattern has a smaller size than the second aperture. A deflector is positioned between the first and second aperture members for deflecting the electron beam. A controller is connected to the deflector for controlling a deflection by the deflector to the electron beam on a transmission between first and second aperture members. The controller includes: a first section being connected to a first memory for reading data of write-required patterns out of the first memory to divide each of the write-required patterns into a plurality of unit patterns; and a second section being connected to the first section for fetching the unit patterns and also connected to a second memory for reading out data of the shape of the at least one aperture mask pattern so as to collate the unit patterns with the shape of the at least one aperture mask pattern to confirm any correspondence between the unit patterns and the shape of the at least one aperture mask pattern, so that if the correspondence between the unit patterns and the shape of the at least one aperture mask pattern is confirmed, then the controller controls the deflection to allow that the electron beam penetrated through and shaped by the at least one aperture mask pattern is passed through the second aperture whereby the electron beam is shaped in accordance with the shape of the at least one aperture mask pattern, and so that if no correspondence between the unit patterns and the shape of the at least one aperture mask pattern is confirmed, then the controller controls the deflection to allow that the electron beam penetrated through and shaped by the first aperture is transmitted toward the second aperture whereby the electron beam is shaped by a combination of the first and second apertures for the variable shaped electron beam exposure.

It is preferable that the first aperture member has a set of plural aperture mask patterns differing in shape from each other, and the second section collates the unit patterns with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the controller controls the deflection to allow that the electron beam penetrated through and shaped by a corresponding one of the plural aperture mask patterns is passed through the second aperture whereby the electron beam is shaped in accordance with the shape of the corresponding one of the plural aperture mask patterns, and so that if no correspondence between the unit patterns and any of the shapes of the plural aperture mask patterns is confirmed, then the controller controls the deflection to allow that the electron beam penetrated through and shaped by the first aperture is passed through the second aperture whereby the electron beam is shaped by a combination of the first and second apertures for the variable shaped electron beam exposure.

It is preferable that the first aperture is positioned at a center of the first aperture member and the plural aperture mask patterns are positioned around the first aperture.

In accordance with the above seventh present invention, any of the plural aperture mask patterns is optionally and effectively used for the variable shaped electron beam exposure. For this reason, a total number of the unit patterns divided from the write-required patterns is remarkably reduced as compared to the prior art. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

The eighth present invention provides a computer-readable storage medium for storing a computer program for controlling a deflection of an electron beam by a deflector provided in a variable shaped electron beam exposure system. The deflection is made to the electron beam on a transmission between first and second aperture members positioned to have a distance along which the electron beam is transmitted, and the first and second aperture members having first and second apertures for shaping the electron beam so that the electron beam is first transmitted through the first aperture member and then transmitted through the second aperture member. The second aperture member further has at least one aperture mask pattern with a shape different from a shape of the second aperture and the at least one aperture mask pattern also having a smaller size than the first aperture. The computer program includes the steps of: reading out data of write-required patterns to divide each of the write-requited patterns into a plurality of unit patterns; fetching the unit patterns and reading out data of the shape of the at least one aperture mask pattern; and collating the unit patterns with the shape of the at least one aperture mask pattern to confirm any correspondence between the unit patterns and the shape of the at least one aperture mask pattern, so that if the correspondence between the unit patterns and the shape of the at least one aperture mask pattern is confirmed, then the deflection is controlled to allow the electron beam to be transmitted toward the at least one aperture mask pattern of the second aperture member whereby the electron beam is shaped in accordance with the shape of the at least one aperture mask pattern, and so that if no correspondence between the unit patterns and the shape of the at least one aperture mask pattern is confirmed, then the deflection is controlled to allow the electron beam to be transmitted toward the second aperture whereby the electron beam is shaped by a combination of the first and second apertures for the variable shaped electron beam exposure.

It is preferable that the second aperture member has a set of plural aperture mask patterns differing in shape from each other, and the third step collates the unit patterns with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the deflection is controlled to allow the electron beam to be transmitted toward a corresponding one of the plural aperture mask patterns of the second aperture member whereby the electron beam is shaped in accordance with the shape of the corresponding one of the plural aperture mask patterns, and so that if no correspondence between the unit patterns and any of the shapes of the plural aperture mask patterns is confirmed, then the deflection is controlled to allow the electron beam to be transmitted toward the second aperture whereby the electron beam is shaped by a combination of the first and second apertures for the variable shaped electron beam exposure.

It is also preferable that all of the unit patterns divided from all of the write-required patterns have been collated with the shape of the at least one aperture mask pattern to confirm any correspondence between the unit patterns and the shape of the at least one aperture mask pattern before the variable shaped electron beam exposures are conducted to the all of the unit patterns.

It is also preferable that a set of the third collation step and subsequent variable shaped electron beam exposure is sequentially conducted to each of the unit patterns divided from all of the write-required patterns.

In accordance with the above eighth present invention, any of the plural aperture mask patterns is optionally and effectively used for the variable shaped electron beam exposure. For this reason, a total number of the unit patterns divided from the write-required patterns is remarkably reduced as compared to the prior art. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

The ninth present invention provides a computer-readable storage medium for storing a computer program for controlling a deflection of an electron beam by a deflector provided in a variable shaped electron beam exposure system. The deflection is made to the electron beam on a transmission between first and second aperture members positioned to have a distance along which the electron beam is transmitted. The first and second aperture members have first and second apertures for shaping the electron beam so that the electron beam is first transmitted through the first aperture member and then transmitted through the second aperture member. The first aperture member further has at least one aperture mask pattern with a shape different from a shape of the first aperture and the at least one aperture mask pattern also has a smaller size than the second aperture. The computer program includes the steps of: reading out data of write-required patterns to divide each of the write-required patterns into a plurality of unit patterns; fetching the unit patterns and reading out data of the shape of the at least one aperture mask pattern; and collating the unit patterns with the shape of the at least one aperture mask pattern to confirm any correspondence between the unit patterns and the shape of the at least one aperture mask pattern, so that if the correspondence between the unit patterns and the shape of the at least one aperture mask pattern is confirmed, then the deflection is controlled to allow that the electron beam penetrated through and shaped by the at least one aperture mask pattern is passed through the second aperture whereby the electron beam is shaped in accordance with the shape of the at least one aperture mask pattern, and so that if no correspondence between the unit patterns and the shape of the at least one aperture mask pattern is confirmed, then the deflection is controlled to allow that the electron beam penetrated through and shaped by the first aperture is transmitted toward the second aperture whereby the electron beam is shaped by a combination of the first and second apertures for the variable shaped electron beam exposure.

It is preferable that the first aperture member has a set of plural aperture mask patterns differing in shape from each other, and the third step collates the unit patterns with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the deflection is controlled to allow that the electron beam penetrated through and shaped by a corresponding one of the plural aperture mask patterns is passed through the second aperture whereby the electron beam is shaped in accordance with the shape of the corresponding one of the plural aperture mask patterns, and so that if no correspondence between the unit patterns and any of the shapes of the plural aperture mask patterns is confirmed, then the deflection is controlled to allow that the electron beam penetrated through and shaped by the first aperture is passed through the second aperture whereby the electron beam is shaped by a combination of the first and second apertures for the variable shaped electron beam exposure.

It is also preferable that all of the unit patterns divided from all of the write-required patterns have been collated with the shape of the at least one aperture mask pattern to confirm any correspondence between the unit patterns and the shape of the at least one aperture mask pattern before the variable shaped electron beam exposures are conducted to the all of the unit patterns.

It is also preferable that a set of the third collation step and subsequent variable shaped electron beam exposure is sequentially conducted to each of the unit patterns divided from all of the write-required patterns.

In accordance with the above ninth present invention, any of the plural aperture mask patterns is optionally and effectively used for the variable shaped electron beam exposure. For this reason, a total number of the unit patterns divided from the write-required patterns is remarkably reduced as compared to the prior art. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

The tenth present invention provides a method of controlling a deflection of an electron beam by a deflector provided in a variable shaped electron beam exposure system. The deflection is made to the electron beam on a transmission between first and second aperture members positioned to have a distance along which the electron beam is transmitted. The first and second aperture members have first and second apertures for shaping the electron beam so that the electron beam is first transmitted through the first aperture member and then transmitted through the second aperture member. The second aperture member further has at least one aperture mask pattern with a shape different from a shape of the second aperture and the at least one aperture mask pattern also having a smaller size than the first aperture. The method includes the steps of: reading out data of write-required patterns to divide each of the write-required patterns into a plurality of unit patterns; fetching the unit patterns and reading out data of the shape of the at least one aperture mask pattern; and collating the unit patterns with the shape of the at least one aperture mask pattern to confirm any correspondence between the unit patterns and the shape of the at least one aperture mask pattern, so that if the correspondence between the unit patterns and the shape of the at least one aperture mask pattern is confirmed, then the deflection is controlled to allow the electron beam to be transmitted toward the at least one aperture mask pattern of the second aperture member whereby the electron beam is shaped in accordance with the shape of the at least one aperture mask pattern, and so that if no correspondence between the unit patterns and the shape of the at least one aperture mask pattern is confirmed, then the deflection is controlled to allow the electron beam to be transmitted toward the second aperture whereby the electron beam is shaped by a combination of the first and second apertures for the variable shaped electron beam exposure.

It is preferable that the second aperture member has a set of plural aperture mask patterns differing in shape from each other, and the third step collates the unit patterns with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the deflection is controlled to allow the electron beam to be transmitted toward a corresponding one of the plural aperture mask patterns of the second aperture member whereby the electron beam is shaped in accordance with the shape of the corresponding one of the plural aperture mask patterns, and so that if no correspondence between the unit patterns and any of the shapes of the plural aperture mask patterns is confirmed, then the deflection is controlled to allow the electron beam to be transmitted toward the second aperture whereby the electron beam is shaped by a combination of the first and second apertures for the variable shaped electron beam exposure.

It is also preferable that all of the unit patterns divided from all of the write-required patterns have been collated with the shape of the at least one aperture mask pattern to confirm any correspondence between the unit patterns and the shape of the at least one aperture mask pattern before the variable shaped electron beam exposures are conducted to the all of the unit patterns.

It is also preferable that a set of the third collation step and subsequent variable shaped electron beam exposure is sequentially conducted to each of the unit patterns divided from all of the write-required patterns.

In accordance with the above tenth present invention, any of the plural aperture mask patterns is optionally and effectively used for the variable shaped electron beam exposure. For this reason, a total number of the unit patterns divided from the write-required patterns is remarkably reduced as compared to the prior art. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

The eleventh present invention provides a method of controlling a deflection of an electron beam by a deflector provided in a variable shaped electron beam exposure system. The deflection is made to the electron beam on a transmission between first and second aperture members positioned to have a distance along which the electron beam is transmitted. The first and second aperture members have first and second apertures for shaping the electron beam so that the electron beam is first transmitted through the first aperture member and then transmitted through the second aperture member. The first aperture member further has at least one aperture mask pattern with a shape different from a shape of the first aperture and the at least one aperture mask pattern also has a smaller size than the second aperture. The method includes the steps of: reading out data of write-required patterns to divide each of the write-required patterns into a plurality of unit patterns; fetching the unit patterns and reading out data of the shape of the at least one aperture mask pattern; and collating the unit patterns with the shape of the at least one aperture mask pattern to confirm any correspondence between the unit patterns and the shape of the at least one aperture mask pattern, so that if the correspondence between the unit patterns and the shape of the at least one aperture mask pattern is confirmed, then the deflection is controlled to allow that the electron beam penetrated through and shaped by the at least one aperture mask pattern is passed through the second aperture whereby the electron beam is shaped in accordance with the shape of the at least one aperture mask pattern, and so that if no correspondence between the unit patterns and the shape of the at least one aperture mask pattern is confirmed, then the deflection is controlled to allow that the electron beam penetrated through and shaped by the first aperture is transmitted toward the second aperture whereby the electron beam is shaped by a combination of the first and second apertures for the variable shaped electron beam exposure.

It is preferable that the first aperture member has a set of plural aperture mask patterns differing in shape from each other, and the third step collates the unit patterns with the shapes of the plural aperture mask patterns to confirm any correspondence between the unit patterns and the shapes of the plural aperture mask patterns, so that if any correspondence between the unit patterns and any of the shapes of the plural aperture mask patterns is confirmed, then the deflection is controlled to allow that the electron beam penetrated through and shaped by a corresponding one of the plural aperture mask patterns is passed through the second aperture whereby the electron beam is shaped in accordance with the shape of the corresponding one of the plural aperture mask patterns, and so that if no correspondence between the unit patterns and any of the shapes of the plural aperture mask patterns is confirmed, then the deflection is controlled to allow that the electron beam penetrated through and shaped by the first aperture is passed through the second aperture whereby the electron beam is shaped by a combination of the first and second apertures for the variable shaped electron beam exposure.

It is also preferable that all of the unit patterns divided from all of the write-required patterns have been collated with the shape of the at least one aperture mask pattern to confirm any correspondence between the unit patterns and the shape of the at least one aperture mask pattern before the variable shaped electron beam exposures are conducted to the all of the unit patterns.

It is also preferable that a set of the third collation step and subsequent variable shaped electron beam exposure is sequentially conducted to each of the unit patterns divided from all of the write-required patterns.

In accordance with the above eleventh present invention, any of the plural aperture mask patterns is optionally and effectively used for the variable shaped electron beam exposure. For this reason, a total number of the unit patterns divided from the write-required patterns is remarkably reduced as compared to the prior art. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

PREFERRED EMBODIMENTS

First Embodiment

Figure 3:
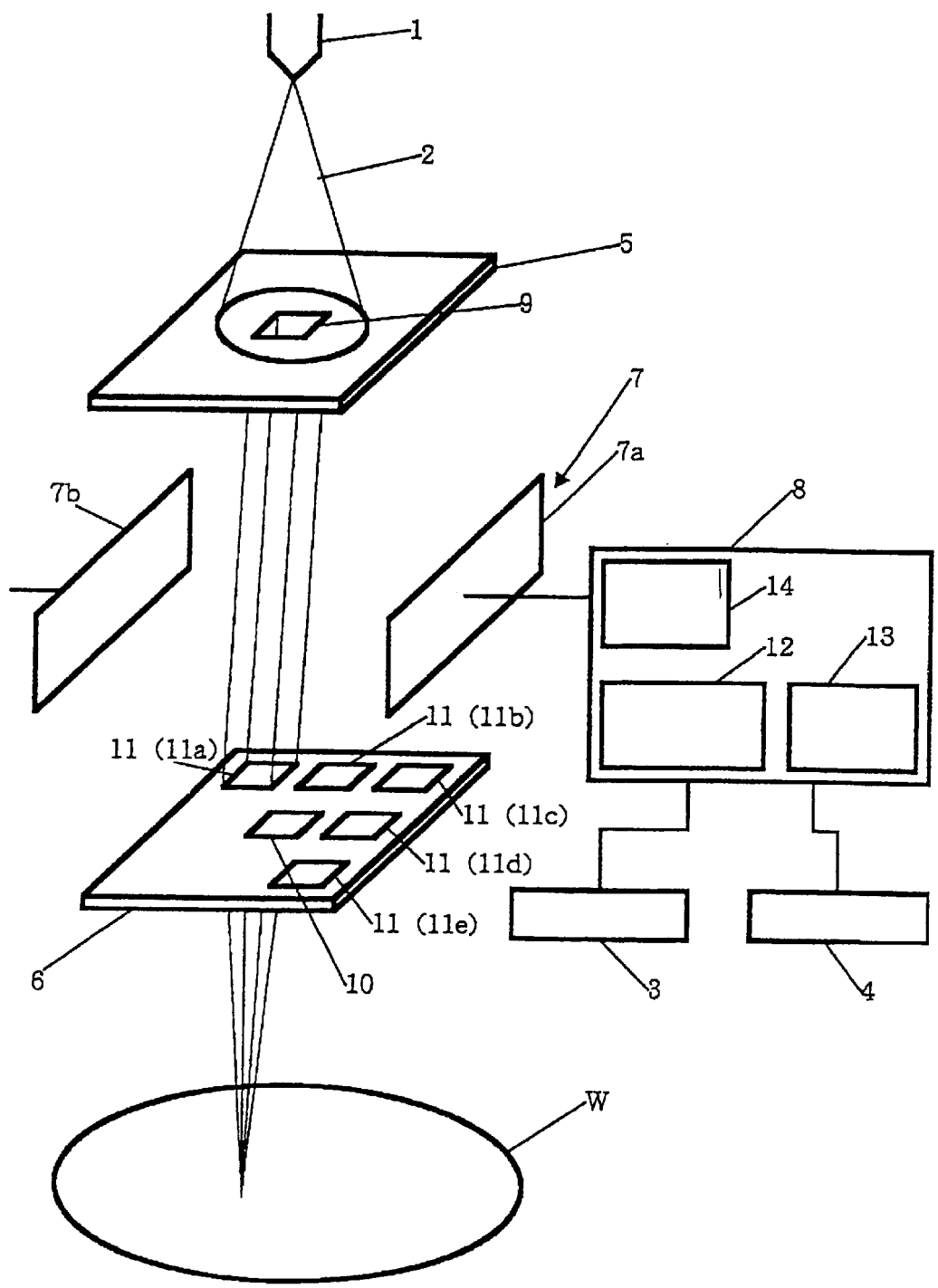
FIG. 3 is a schematic view illustrative of a novel variable shaped electron beam exposure system in first to third embodiments in accordance with the present invention.

A first embodiment according to the present invention will be described in detail with reference to FIG. 3 which is a schematic view illustrative of a novel variable shaped electron beam exposure system. An electron gum 1 is provided for emitting an electron beam 2. A pair of first and second aperture members 5 and 6 is positioned to have a distance in a direction along which the electron beam 2 is transmitted. The first and second aperture members have first and second apertures 9 and 10 for shaping the electron beam 2 so that the electron beam 2 is first transmitted through the first aperture 9 and then transmitted through the second aperture 10 for forming a variable shaped electron beam which will be irradiated onto a resist over a wafer "W". The first and second apertures 9 and 10 are square-shaped to have the same size as each other. The second aperture member 6 further has a set of five aperture mask patterns 11a, 11b, 11c, 11d, and 11e which differ in shape from each other. Each of the five aperture mask patterns 11a, 11b, 11c, 11d, and 11e has a size not larger than the first and second apertures 9 and 10. Namely, the five aperture mask patterns 11a, 11b, 11c, 11d, and 11e are formed within a square-shaped area which has the same definition as the first and second square-shaped apertures 9 and 10.

Figure 4:
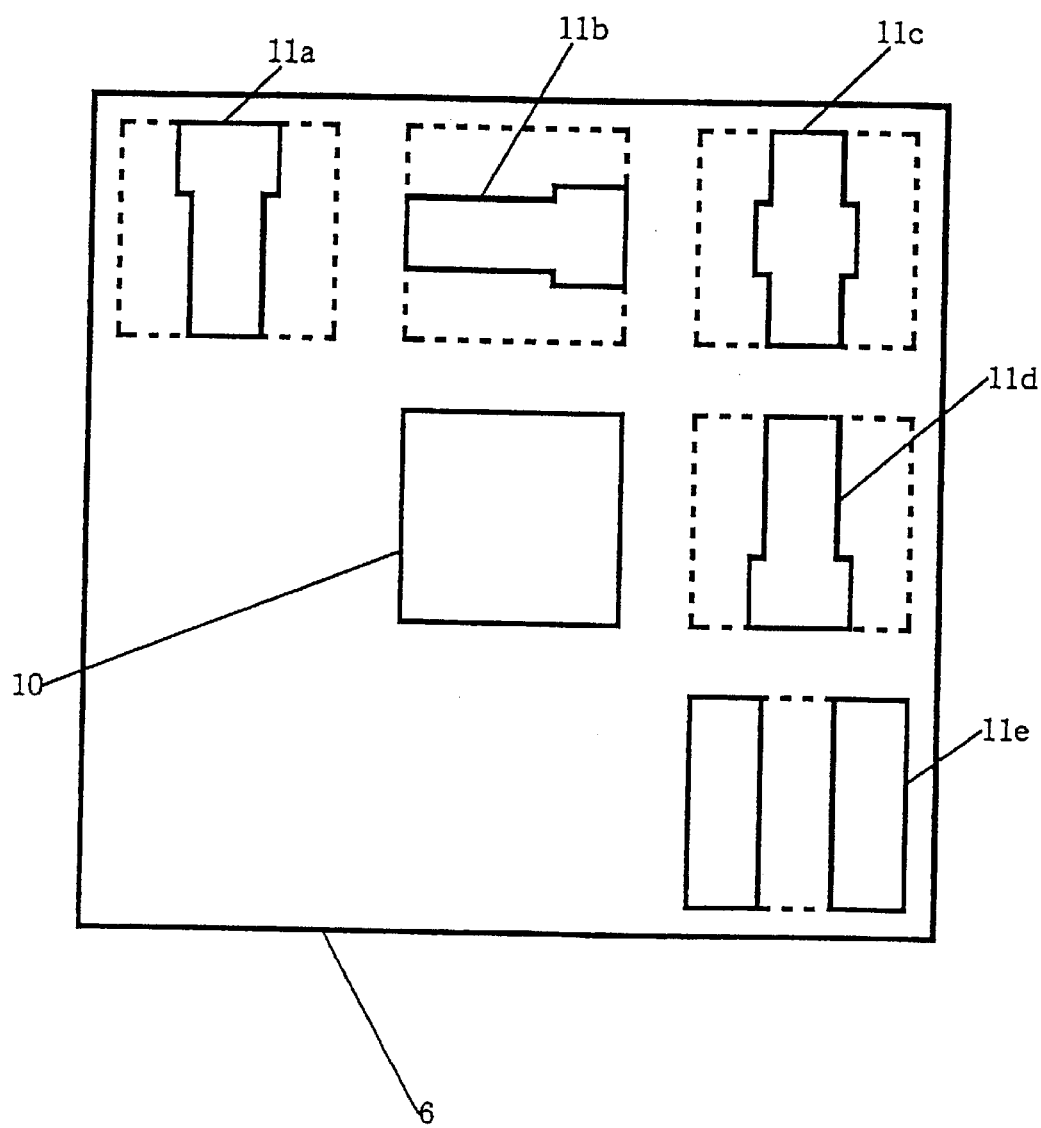
FIG. 4 is a plane view illustrative of a second aperture member having a second square-shaped aperture and five aperture mask patterns in first to fifth embodiments in accordance with the present invention.

FIG. 4 is a plane view illustrative of the second aperture member 6 having the second square-shaped aperture 10 and the five aperture mask patterns 11a, 11b, 11c, 11d, and 11e. The five aperture mask patterns 11a, 11b, 11c, 11d, and 11e comprise openings with predetermined shapes as represented by the real lines and are formed within square-shaped areas represented by broken lines. The square-shaped areas have the same size as each other and as the second square-shaped aperture 10. The first, second and third aperture mask patterns 11a, 11b and 11c are aligned along a first side of the square-shaped second aperture member 6. The third, fourth and fifth aperture mask patterns 11c, 11d and 11e are aligned along a second side adjacent to the first side of the square-shaped second aperture member 6 so that the first and fifth aperture mask patterns 11a and 11e are positioned at opposite corners of the square-shaped second aperture member 6. The second aperture mask pattern 11a is formed at an intermediate position between the first and third aperture mask patterns 11a and 11c. The fourth aperture mask pattern 11d is formed at an intermediate position between the third and fifth aperture mask patterns 11c and 11e. The third aperture mask pattern 11c is positioned at the corner at which the first and second sides are crossed to each other at the right angle. The first aperture mask pattern 11a has a first-modified rectangle shape with a wide portion, which has a longitudinal axis extending in a first direction in parallel to the second side of the square-shaped second aperture member 6. The first aperture mask pattern 11a extends within the square-shaped area from one side to opposite side, both of which are distanced in the first direction. The wide portion is formed adjacent to the one side being closer to the first side of the square-shaped second aperture member 6. The first aperture mask pattern 11a is symmetrical with reference to the longitudinal axis thereof, which extends on a center of the square-shaped area. The second aperture mask pattern 11b has a second-modified rectangle shape with a wide portion, which has a longitudinal axis extending in a second direction in parallel to the first side of the square-shaped second aperture member 6. The second aperture mask pattern 11b extends within the square-shaped area from one side to opposite side, both of which are distanced in the second direction. The wide portion is formed adjacent to the one side being closer to the third aperture mask pattern 11b. The second aperture mask pattern 11b is symmetrical with reference to the longitudinal axis thereof, which extends on a center of the square-shaped area. The third aperture mask pattern 11c has a third-modified rectangle shape with a wide portion, which has a longitudinal axis extending in the first direction in parallel to the second side of the square-shaped second aperture member 6. The third aperture mask pattern 11c extends within the square-shaped area from one side to opposite side, both of which are distanced in the first direction. The wide portion is formed at the center of the third aperture mask pattern 11c or at the center of the square-shaped area. The third aperture mask pattern 11c is symmetrical with reference to both the longitudinal axis thereof and a short axis perpendicular to the longitudinal axis. The fourth aperture mask pattern 11d has a fourth-modified rectangle shape with a wide portion, which has a longitudinal axis extending in the first direction in parallel to the second side of the square-shaped second aperture member 6. The fourth aperture mask pattern 11d extends within the square-shaped area from one side to opposite side, both of which are distanced in the first direction. The wide portion is formed adjacent to the opposite side being closer to the fifth aperture mask pattern 11e. The fourth aperture mask pattern 11d is symmetrical with reference to the longitudinal axis thereof, which extends on a center of the square-shaped area. The fifth aperture mask pattern 11e has a pair of rectangles having longitudinal axes extending in the first direction in parallel to the second side of the square-shaped second aperture member 6. The paired rectangles of the fifth aperture mask pattern 11e extend within the square-shaped area from a first side to a second side opposite to the first side, wherein the first and second sides are distanced in the first direction. The paired rectangles of the fifth aperture mask pattern 11e also extend along a third side of the square-shaped area and a fourth side thereof opposite to the third side respectively, so that the paired rectangles of the fifth aperture mask pattern 11e are distanced from each other in the second direction in parallel to the first side of the square-shaped second aperture member 6. Namely, the paired rectangles of the fifth aperture mask pattern 11e extend to sandwich a rectangular-shaped center region having a longitudinal axis parallel to the first direction. The fifth aperture mask pattern 11e is symmetrical with reference to both the longitudinal axis thereof and a short axis perpendicular to the longitudinal axis.

With reference back to FIG. 3, a deflector 7 is provided between the first and second aperture members 5 and 6 for deflecting the electron beam 2 on the transmission between the first and second aperture members 5 and 6. The deflector 7 comprises a pair of deflecting electrode plates 7a and 7b for applying an electric field to a space between the paired deflecting electrode plates 7a and 7b, wherein the electron beam 2 having passed through the first aperture member 5 is transmitted through the space applied with the electric field by the paired deflecting electrode plates 7a and 7b whereby the electron beam 2 is deflected in accordance with the applied electric field. It is possible to control the deflection of the electron beam 2 by controlling the electric field applied to the electron beam. The electron beam having passed through the first square-shaped aperture 9 of the first aperture member 5 is so deflected by the deflector 7 as to be transmitted toward a selected one of the second square-shaped aperture 10 and the five aperture mask patterns 11a, 11b, 11c, 11d and 11e.

As a modification to the above deflector 7, it is also possible to deflect the electron beam by applying a magnetic field to the electron beam in place of the electric field.

A controller 8 is further provided which is connected to the deflector 7 for controlling the deflection by the deflector 7 to the electron beam 2 on the transmission between the first and second aperture members 5 and 6. The controller 8 includes a pattern-divider 12 being connected to a data memory 3 for reading data of write-required patterns out of the data memory 3 to divide each of the write-required patterns into a plurality of unit patterns.

Figure 5:
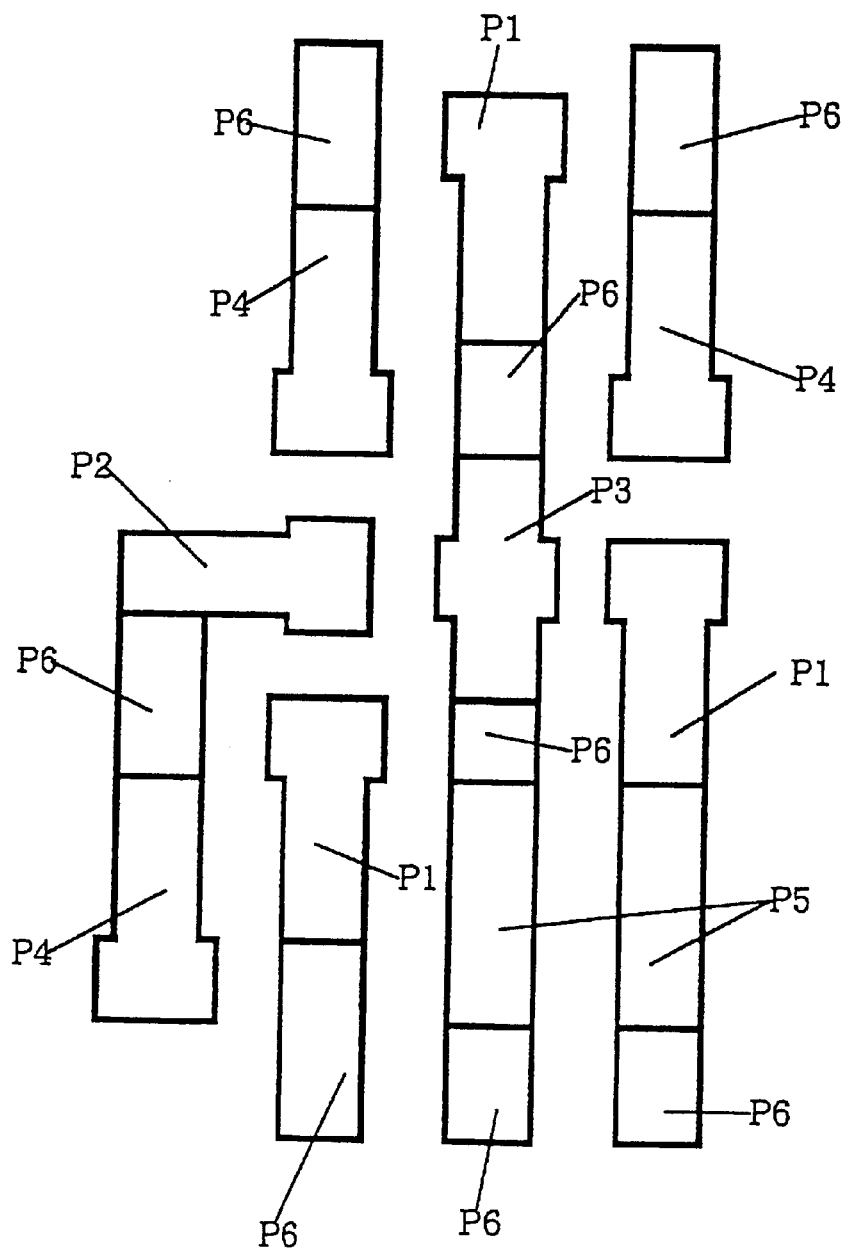
FIG. 5 is a diagram illustrative of six write-required patterns divided into seventeen unit patterns by a pattern divider in a controller of a novel variable shaped electron beam exposure system.

FIG. 5 is a diagram illustrative of the six write-required patterns divided into seventeen unit patterns by the pattern divider 12 in the controller 8 of the novel variable shaped electron beam exposure system. The divided seventeen unit patterns are classified into six types. There exist three of the first type unit pattern P1 which corresponds to the first aperture mask pattern 11a of the second aperture member 6 shown in FIG. 4. There exists one of the second type unit pattern P2 which corresponds to the second aperture mask pattern 11b of the second aperture member 6. There exists one of the third type unit pattern P3 which corresponds to the third aperture mask pattern 11c of the second aperture member 6. There exist three of the fourth type unit pattern P4 which corresponds to the fourth aperture mask pattern 11d of the second aperture member 6. There exists one of the fifth type unit pattern P5 which corresponds to the fifth aperture mask pattern 11e of the second aperture member 6. There exist eight of the sixth type unit pattern P6 which does not correspond to any of the five aperture mask patterns 11a, 11b, 11c, 11d and 11e of the second aperture member 6.

The controller 8 further includes a data-collator 13 being connected to the pattern-divider 12 for fetching the divided unit patterns and also connected to a buffer memory 4 for reading out data of the shape of the above five aperture mask patterns 11a, 11b, 11c, 11d and 11e so as to collate the unit patterns with the shapes of the above five aperture mask patterns 11a, 11b, 11c, 11d and 11e to confirm any correspondence between the unit patterns and the shape of any of the above five aperture mask patterns 11a, 11b, 11c, 11d and 11e. As a result of the collation, the data-collator 13 confirm the correspondences as follows. The first type unit patterns P1 correspond to the first aperture mask pattern 11a. The second type unit pattern P2 corresponds to the second aperture mask pattern 11b. The third type unit pattern P3 corresponds to the third aperture mask pattern 11c. The fourth type unit pattern P4 corresponds to the fourth aperture mask pattern 11d. The fifth type unit pattern P5 corresponds to the fifth aperture mask pattern 11e of the second aperture member 6. The sixth type unit patterns P6 do not correspond to any of the five aperture mask patterns 11a, 11b, 11c, 11d and 11e of the second aperture member 6.

The controller 8 further includes a deflection-controller 14 being connected to the data-collator 13 for fetching the results of the collations to control the electric field applied by the deflector 7 to the electron beam 2 in accordance with the result of the correspondence of the individual unit patterns with any of the five aperture mask patterns 11a, 11b, 11c, 11d and 11e.

If the correspondence of the first type unit pattern P1 with the first aperture mask pattern 11a is confirmed by the data-collator 13, then the deflection-controller 14 controls the deflection to allow the electron beam 2 to be transmitted toward the first aperture mask pattern 11a of the second aperture member 6, whereby the electron beam 2 is shaped in accordance with the shape of the first aperture mask pattern 11a. The electron beam 2 having passed through the first aperture mask pattern 11a of the second aperture member 6 is then irradiated onto the resist over the wafer "W" thereby to write the first type unit pattern P1 on the resist.

If the correspondence of the second type unit pattern P2 with the second aperture mask pattern 11b is confirmed by the data-collator 13, then the deflection-controller 14 controls the deflection to allow the electron beam 2 to be transmitted toward the second aperture mask pattern 11b of the second aperture member 6, whereby the electron beam 2 is shaped in accordance with the shape of the second aperture mask pattern 11b. The electron beam 2 having passed through the second aperture mask pattern 11b of the second aperture member 6 is then irradiated onto the resist over the wafer "W" thereby to write the second type unit pattern P2 on the resist.

If the correspondence of the third type unit pattern P3 with the third aperture mask pattern 11c is confirmed by the data-collator 13, then the deflection-controller 14 controls the deflection to allow the electron beam 2 to be transmitted toward the third aperture mask pattern 11c of the second aperture member 6, whereby the electron beam 2 is shaped in accordance with the shape of the third aperture mask pattern 11c. The electron beam 2 having passed through the third aperture mask pattern 11c of the second aperture member 6 is then irradiated onto the resist over the wafer "W" thereby to write the third type unit pattern P3 on the resist.

If the correspondence of the fourth type unit pattern P4 with the fourth aperture mask pattern 11d is confirmed by the data-collator 13, then the deflection-controller 14 controls the deflection to allow the electron beam 2 to be transmitted toward the fourth aperture mask pattern 11d of the second aperture member 6, whereby the electron beam 2 is shaped in accordance with the shape of the fourth aperture mask pattern 11d. The electron beam 2 having passed through the fourth aperture mask pattern 11d of the second aperture member 6 is then irradiated onto the resist over the wafer "W" thereby to write the fourth type unit pattern P4 on the resist.

If the correspondence of the fifth type unit pattern P5 with the fifth aperture mask pattern lie is confirmed by the data-collator 13, then the deflection-controller 14 controls the deflection to allow the electron beam 2 to be transmitted toward the fifth aperture mask pattern 11e of the second aperture member 6, whereby the electron beam 2 is shaped in accordance with the shape of the fifth aperture mask pattern 11e. The electron beam 2 having passed through the fifth aperture mask pattern 11e of the second aperture member 6 is then irradiated onto the resist over the wafer "W" thereby to write the fifth type unit pattern P5 on the resist.

If, however, no correspondence of the sixth type unit pattern P6 with any of the above five aperture mask patterns 11a, 11b, 11c, 11d and 11e is confirmed by the data-collator 13, then the deflection-controller 14 controls the deflection to allow the electron beam 2 to be transmitted toward the square-shaped second aperture 10 of the second aperture member 6, whereby the electron beam 2 is shaped by a combination of the first and second apertures in accordance with the same function as the normal variable shaped electron beam exposure system, for example, by a relative movement of the first and second aperture members 5 and 6.

Figure 6:
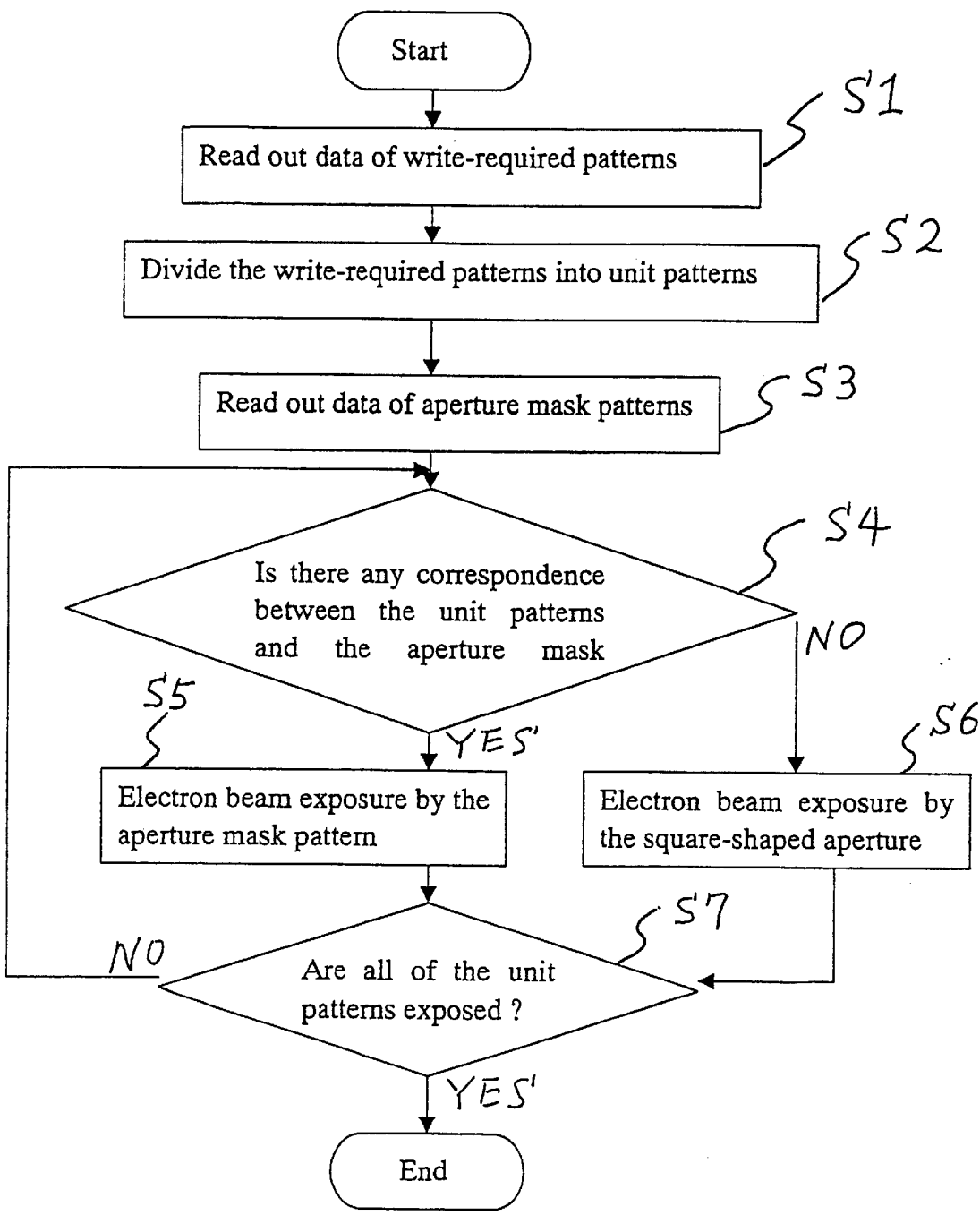
FIG. 6 is a flow chart illustrative of operations of a novel variable shaped electron beam exposure system in first, third and fourth embodiments in accordance with the present invention.

The following descriptions will focus on operations of the above novel variable shaped electron beam exposure system. FIG. 6 is a flow chart illustrative of operations of the novel variable shaped electron beam exposure system.

In a first step S1, data of write-required patterns are read by the pattern-divider 12 out of the data memory 3.

In a second step S2, each of the write-required patterns is divided by the pattern-divider 12 into a plurality of unit patterns.

In a third step S3, data of the shape of the above five aperture mask patterns 11a, 11b, 11c, 11d and 11e are read by the data-collator 13 out of the buffer memory 3.

In a fourth step S4, the unit pattern is collated by the data-collator 13 with the shapes of the above five aperture mask patterns 11a, 11b, 11c, 11d and 11e to confirm any correspondence between the unit pattern and the shape of any of the above five aperture mask patterns 11a, 11b, 11c, 11d and 11e.

In a fifth step S5, the results of the collations are fetched by the deflection-controller 14 to control the electric field applied by the deflector 7 to the electron beam 2 in accordance with the result of the correspondence of the individual unit patterns with any of the five aperture mask patterns 11a, 11b, 11c, 11d and 11e.

If the correspondence of the first type unit pattern Pi with the first aperture mask pattern 11a is confirmed by the data-collator 13, then the deflection-controller 14 controls the deflection to allow the electron beam 2 to be transmitted toward the first aperture mask pattern 11a of the second aperture member 6, whereby the electron beam 2 is shaped in accordance with the shape of the first aperture mask pattern 11a. The electron beam 2 having passed through the first aperture mask pattern 11a of the second aperture member 6 is then irradiated onto the resist over the wafer "W" thereby to write the first type unit pattern P1 on the resist.

If the correspondence of the second type unit pattern P2 with the second aperture mask pattern 11b is confirmed by the data-collator 13, then the deflection-controller 14 controls the deflection to allow the electron beam 2 to be transmitted toward the second aperture mask pattern 11b of the second aperture member 6, whereby the electron beam 2 is shaped in accordance with the shape of the second aperture mask pattern 11b. The electron beam 2 having passed through the second aperture mask pattern 11b of the second aperture member 6 is then irradiated onto the resist over the wafer "W" thereby to write the second type unit pattern P2 on the resist.

If the correspondence of the third type unit pattern P3 with the third aperture mask pattern 11c is confirmed by the data-collator 13, then the deflection-controller 14 controls the deflection to allow the electron beam 2 to be transmitted toward the third aperture mask pattern 11c of the second aperture member 6, whereby the electron beam 2 is shaped in accordance with the shape of the third aperture mask pattern 11c. The electron beam 2 having passed through the third aperture mask pattern 11c of the second aperture member 6 is then irradiated onto the resist over the wafer "W" thereby to write the third type unit pattern P3 on the resist.

If the correspondence of the fourth type unit pattern P4 with the fourth aperture mask pattern 11d is confirmed by the data-collator 13, then the deflection-controller 14 controls the deflection to allow the electron beam 2 to be transmitted toward the fourth aperture mask pattern 11d of the second aperture member 6, whereby the electron beam 2 is shaped in accordance with the shape of the fourth aperture mask pattern 11d. The electron beam 2 having passed through the fourth aperture mask pattern 11d of the second aperture member 6 is then irradiated onto the resist over the wafer "W" thereby to write the fourth type unit pattern P4 on the resist.

If the correspondence of the fifth type unit pattern P5 with the fifth aperture mask pattern 11e is confirmed by the data-collator 13, then the deflection-controller 14 controls the deflection to allow the electron beam 2 to be transmitted toward the fifth aperture mask pattern 11e of the second aperture member 6, whereby the electron beam 2 is shaped in accordance with the shape of the fifth aperture mask pattern 11e. The electron beam 2 having passed through the fifth aperture mask pattern 11e of the second aperture member 6 is then irradiated onto the resist over the wafer "W" thereby to write the fifth type unit pattern P5 on the resist.

In a sixth step S6, if, however, no correspondence of the sixth type unit pattern P6 with any of the above five aperture mask patterns 11a, 11b, 11c, 11d and 11e is confirmed by the data-collator 13, then the deflection-controller 14 controls the deflection to allow the electron beam 2 to be transmitted toward the square-shaped second aperture 10 of the second aperture member 6, whereby the electron beam 2 is shaped by a combination of the first and second apertures in accordance with the same function as the normal variable shaped electron beam exposure system, for example, by a relative movement of the first and second aperture members 5 and 6.

In a seventh step S7, it is verified whether or not all of the divided unit patterns have been written to write all of the write-required patterns on the resist. If verified, the processes will end. If, however, any of the divided unit patterns have not yet been written on the resist, then the process will back to the above fourth step S4 so that the series of the fourth and fifth steps or the fourth and sixth steps will be repeated until all of the divided unit patterns have been written.

In accordance with the above present invention, a total number of the unit patterns divided from the six write-required patterns is remarkably reduced to seventeen, whilst the conventional system divides the six write-required patterns into thirty three unit patterns. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

Second Embodiment

A second embodiment according to the present invention will be described in detail with reference again to FIG. 3. A difference of the second embodiment from the first embodiment is in the processes of the variable shaped electron beam exposure. An electron gum 1 is provided for emitting an electron beam 2. A pair of first and second aperture members 5 and 6 is positioned to have a distance in a direction along which the electron beam 2 is transmitted. The first and second aperture members have first and second apertures 9 and 10 for shaping the electron beam 2 so that the electron beam 2 is first transmitted through the first aperture 9 and then transmitted through the second aperture 10 for forming a variable shaped electron beam which will be irradiated onto a resist over a wafer "W". The first and second apertures 9 and 10 are square-shaped to have the same size as each other. The second aperture member 6 further has a set of five aperture mask patterns 11a, 11b, 11c, 11d, and 11e which differ in shape from each other. Each of the five aperture mask patterns 11a, 11b, 11c, 11d, and 11e has a size not larger than the first and second apertures 9 and 10. Namely, the five aperture mask patterns 11a, 11b, 11c, 11d, and 11e are formed within a square-shaped area which has the same definition as the first and second square-shaped apertures 9 and 10.

With reference again to FIG. 4, the five aperture mask patterns 11a, 11b, 11c, 11d, and 11e comprise openings with predetermined shapes as represented by the real lines and are formed within square-shaped areas represented by broken lines. The square-shaped areas have the same size as each other and as the second square-shaped aperture 10. The first, second and third aperture mask patterns 11a, 11b and 11c are aligned along a first side of the square-shaped second aperture member 6. The third, fourth and fifth aperture mask patterns 11c, 11d and 11e are aligned along a second side adjacent to the first side of the square-shaped second aperture member 6 so that the first and fifth aperture mask patterns 11a and 11e are positioned at opposite corners of the square-shaped second aperture member 6. The second aperture mask pattern 11a is formed at an intermediate position between the first and third aperture mask patterns 11a and 11c. The fourth aperture mask pattern 11d is formed at an intermediate position between the third and fifth aperture mask patterns 11c and 11e. The third aperture mask pattern 11c is positioned at the corner at which the first and second sides are crossed to each other at the right angle. The first aperture mask pattern 11a has a first-modified rectangle shape with a wide portion, which has a longitudinal axis extending in a first direction in parallel to the second side of the square-shaped second aperture member 6. The first aperture mask pattern 11a extends within the square-shaped area from one side to opposite side, both of which are distanced in the first direction. The wide portion is formed adjacent to the one side being closer to the first side of the square-shaped second aperture member 6. The first aperture mask pattern 11a is symmetrical with reference to the longitudinal axis thereof, which extends on a center of the square-shaped area. The second aperture mask pattern 11b has a second-modified rectangle shape with a wide portion, which has a longitudinal axis extending in a second direction in parallel to the first side of the square-shaped second aperture member 6. The second aperture mask pattern 11b extends within the square-shaped area from one side to opposite side, both of which are distanced in the second direction. The wide portion is formed adjacent to the one side being closer to the third aperture mask pattern 11b. The second aperture mask pattern 11b is symmetrical with reference to the longitudinal axis thereof, which extends on a center of the square-shaped area. The third aperture mask pattern 11c has a third-modified rectangle shape with a wide portion, which has a longitudinal axis extending in the first direction in parallel to the second side of the square-shaped second aperture member 6. The third aperture mask pattern 11c extends within the square-shaped area from one side to opposite side, both of which are distanced in the first direction. The wide portion is formed at the center of the third aperture mask pattern 11c or at the center of the square-shaped area. The third aperture mask pattern 11c is symmetrical with reference to both the longitudinal axis thereof and a short axis perpendicular to the longitudinal axis. The fourth aperture mask pattern 11d has a fourth-modified rectangle shape with a wide portion, which has a longitudinal axis extending in the first direction in parallel to the second side of the square-shaped second aperture member 6. The fourth aperture mask pattern 11d extends within the square-shaped area from one side to opposite side, both of which are distanced in the first direction. The wide portion is formed adjacent to the opposite side being closer to the fifth aperture mask pattern 11e. The fourth aperture mask pattern 11d is symmetrical with reference to the longitudinal axis thereof, which extends on a center of the square-shaped area. The fifth aperture mask pattern 11e has a pair of rectangles having longitudinal axes extending in the first direction in parallel to the second side of the square-shaped second aperture member 6. The paired rectangles of the fifth aperture mask pattern 11e extend within the square-shaped area from a first side to a second side opposite to the first side, wherein the first and second sides are distanced in the first direction. The paired rectangles of the fifth aperture mask pattern 11e also extend along a third side of the square-shaped area and a fourth side thereof opposite to the third side respectively, so that the paired rectangles of the fifth aperture mask pattern 11e are distanced from each other in the second direction in parallel to the first side of the square-shaped second aperture member 6. Namely, the paired rectangles of the fifth aperture mask pattern 11e extend to sandwich a rectangular-shaped center region having a longitudinal axis parallel to the first direction. The fifth aperture mask pattern 11e is symmetrical with reference to both the longitudinal axis thereof and a short axis perpendicular to the longitudinal axis.

With reference back to FIG. 3, a deflector 7 is provided between the first and second aperture members 5 and 6 for deflecting the electron beam 2 on the transmission between the first and second aperture members 5 and 6 The deflector 7 comprises a pair of deflecting electrode plates 7a and 7b for applying an electric field to a space between the paired deflecting electrode plates 7a and 7b, wherein the electron beam 2 having passed through the first aperture member 5 is transmitted through the space applied with the electric field by the paired deflecting electrode plates 7a and 7b whereby the electron beam 2 is deflected in accordance with the applied electric field. It is possible to control the deflection of the electron beam 2 by controlling the electric field applied to the electron beam. The electron beam having passed through the first square-shaped aperture 9 of the first aperture member 5 is so deflected by the deflector 7 as to be transmitted toward a selected one of the second square-shaped aperture 10 and the five aperture mask patterns 11a, 11b, 11c, 11d and 11e.

As a modification to the above deflector 7, it is also possible to deflect the electron beam by applying a magnetic field to the electron beam in place of the electric field.

A controller 8 is further provided which is connected to the deflector 7 for controlling the deflection by the deflector 7 to the electron beam 2 on the transmission between the first and second aperture members 5 and 6. The controller 8 includes a pattern-divider 12 being connected to a data memory 3 for reading data of write-required patterns out of the data memory 3 to divide each of the write-required patterns into a plurality of unit patterns.

With reference again to FIG. 5, the divided seventeen unit patterns are classified into six types. There exist three of the first type unit pattern P1 which corresponds to the first aperture mask pattern 11a of the second aperture member 6 shown in FIG. 4. There exists one of the second type unit pattern P2 which corresponds to the second aperture mask pattern 11b of the second aperture member 6. There exists one of the third type unit pattern P3 which corresponds to the third aperture mask pattern 11c of the second aperture member 6. There exist three of the fourth type unit pattern P4 which corresponds to the fourth aperture mask pattern 11d of the second aperture member 6 There exists one of the fifth type unit pattern P5 which corresponds to the fifth aperture mask pattern 11e of the second aperture member 6. There exist eight of the sixth type unit pattern P6 which does not correspond to any of the five aperture mask patterns 11a, 11b, 11c, 11d and 11e of the second aperture member 6.

The controller 8 further includes a data-collator 13 being connected to the pattern-divider 12 for fetching the divided unit patterns and also connected to a buffer memory 4 for reading out data of the shape of the above five aperture mask patterns 11a, 11b, 11c, 11d and 11e so as to collate the unit patterns with the shapes of the above five aperture mask patterns 11a, 11b, 11c, 11dand 11e to confirm any correspondence between the unit patterns and the shape of any of the above five aperture mask patterns 11a, 11b, 11c, 11d and 11e. As a result of the collation, the data-collator 13 confirm the correspondences as follows. The first type unit patterns P1 correspond to the first aperture mask pattern 11a. The second type unit pattern P2 corresponds to the second aperture mask pattern 11b. The third type unit pattern P3 corresponds to the third aperture mask pattern 11c. The fourth type unit pattern P4 corresponds to the fourth aperture mask pattern 11d. The fifth type unit pattern P5 corresponds to the fifth aperture mask pattern 11e of the second aperture member 6. The sixth type unit patterns P6 do not correspond to any of the five aperture mask patterns 11a, 11b, 11c, 11d and 11e of the second aperture member 6.

The controller 8 further includes a deflection-controller 14 being connected to the data-collator 13 for fetching the results of the collations to control the electric field applied by the deflector 7 to the electron beam 2 in accordance with the result of the correspondence of the individual unit patterns with any of the five aperture mask patterns 11a, 11b, 11c, 11d and 11e.

If the correspondence of the first type unit pattern P1 with the first aperture mask pattern 11a is confirmed by the data-collator 13, then the deflection-controller 14 controls the deflection to allow the electron beam 2 to be transmitted toward the first aperture mask pattern 11a of the second aperture member 6, whereby the electron beam 2 is shaped in accordance with the shape of the first aperture mask pattern 11a. The electron beam 2 having passed through the first aperture mask pattern 11a of the second aperture member 6 is then irradiated onto the resist over the wafer "W" thereby to write the first type unit pattern P1 on the resist.

If the correspondence of the second type unit pattern P2 with the second aperture mask pattern 11b is confirmed by the data-collator 13, then the deflection-controller 14 controls the deflection to allow the electron beam 2 to be transmitted toward the second aperture mask pattern 11b of the second aperture member 6, whereby the electron beam 2 is shaped in accordance with the shape of the second aperture mask pattern 11b. The electron beam 2 having passed through the second aperture mask pattern 11b of the second aperture member 6 is then irradiated onto the resist over the wafer "W" thereby to write the second type unit pattern P2 on the resist.

If the correspondence of the third type unit pattern P3 with the third aperture mask pattern 11c is confirmed by the data-collator 13, then the deflection-controller 14 controls the deflection to allow the electron beam 2 to be transmitted toward the third aperture mask pattern 11c of the second aperture member 6, whereby the electron beam 2 is shaped in accordance with the shape of the third aperture mask pattern 11c. The electron beam 2 having passed through the third aperture mask pattern 11c of the second aperture member 6 is then irradiated onto the resist over the wafer "W" thereby to write the third type unit pattern P3 on the resist.

If the correspondence of the fourth type unit pattern P4 with the fourth aperture mask pattern 11d is confirmed by the data-collator 13, then the deflection-controller 14 controls the deflection to allow the electron beam 2 to be transmitted toward the fourth aperture mask pattern 11d of the second aperture member 6, whereby the electron beam 2 is shaped in accordance with the shape of the fourth aperture mask pattern 11d. The electron beam 2 having passed through the fourth aperture mask pattern 11d of the second aperture member 6 is then irradiated onto the resist over the wafer "W" thereby to write the fourth type unit pattern P4 on the resist.

If the correspondence of the fifth type unit pattern P5 with the fifth aperture mask pattern 11e is confirmed by the data-collator 13, then the deflection-controller 14 controls the deflection to allow the electron beam 2 to be transmitted toward the fifth aperture mask pattern 11e of the second aperture member 6, whereby the electron beam 2 is shaped in accordance with the shape of the fifth aperture mask pattern 11e. The electron beam 2 having passed through the fifth aperture mask pattern 11e of the second aperture member 6 is then irradiated onto the resist over the wafer "W" thereby to write the fifth type unit pattern P5 on the resist.

If, however, no correspondence of the sixth type unit pattern P6 with any of the above five aperture mask patterns 11a, 11b, 11c, 11d and 11e is confirmed by the data-collator 13, then the deflection-controller 14 controls the deflection to allow the electron beam 2 to be transmitted toward the square-shaped second aperture 10 of the second aperture member 6, whereby the electron beam 2 is shaped by a combination of the first and second apertures in accordance with the same function as the normal variable shaped electron beam exposure system, for example, by a relative movement of the first and second aperture members 5 and 6.

Figure 7:
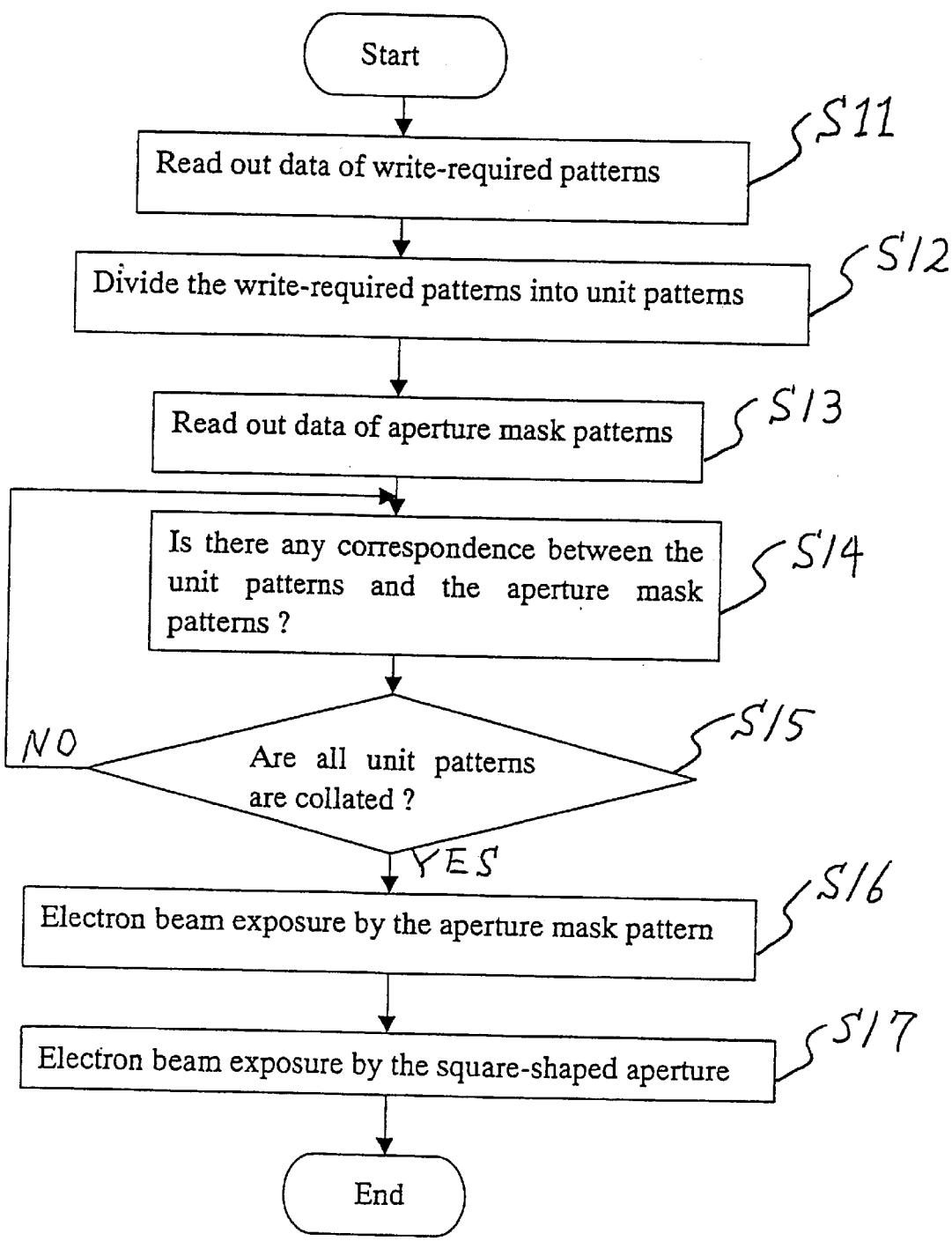
FIG. 7 is a flow chart illustrative of operations of a novel variable shaped electron beam exposure system in second and fifth embodiments in accordance with the present invention.

The following descriptions will focus on operations of the above novel variable shaped electron beam exposure system. FIG. 7 is a flow chart illustrative of operations of the novel variable shaped electron beam exposure system.

In a first step S11, data of write-required patterns are read by the pattern-divider 12 out of the data memory 3.

In a second step S12, each of the write-required patterns is divided by the pattern-divider 12 into a plurality of unit patterns.

In a third step S13, data of the shape of the above five aperture mask patterns 11a, 11b, 11c, 11d and 11e are read by the data-collator 13 out of the buffer memory 3.

In a fourth step S14, the unit pattern is collated by the data-collator 13 with the shapes of the above five aperture mask patterns 11a, 11b, 11c, 11d and 11e to confirm any correspondence between the unit pattern and the shape of any of the above five aperture mask patterns 11a, 11b, 11c, 11d and 11e.

In a fifth step S15, it is verified whether or not all of the divided unit patterns have been collated. If verified, the processes will enter into the following step. If, however, any of the divided unit patterns have not yet been collated, then the above fourth step of collation will be repeated until all of the divided unit patterns have been collated.

In a sixth step S16, the results of the collations are fetched by the deflection-controller 14 to control the electric field applied by the deflector 7 to the electron beam 2 in accordance with the result of the correspondences of the individual unit patterns with any of the five aperture mask patterns 11a, 11b, 11c, 11d and 11e.

If the correspondence of the first type unit pattern P1 with the first aperture mask pattern 11a is confirmed by the data-collator 13, then the deflection-controller 14 controls the deflection to allow the electron beam 2 to be transmitted toward the first aperture mask pattern 11a of the second aperture member 6, whereby the electron beam 2 is shaped in accordance with the shape of the first aperture mask pattern 11a. The electron beam 2 having passed through the first aperture mask pattern 11a of the second aperture member 6 is then irradiated onto the resist over the wafer "W" thereby to write the first type unit pattern P1 on the resist.

If the correspondence of the second type unit pattern P2 with the second aperture mask pattern 11b is confirmed by the data-collator 13, then the deflection-controller 14 controls the deflection to allow the electron beam 2 to be transmitted toward the second aperture mask pattern 11b of the second aperture member 6, whereby the electron beam 2 is shaped in accordance with the shape of the second aperture mask pattern 11b. The electron beam 2 having passed through the second aperture mask pattern 11b of the second aperture member 6 is then irradiated onto the resist over the wafer "W" thereby to write the second type unit pattern P2 on the resist.

If the correspondence of the third type unit pattern P3 with the third aperture mask pattern 11c is confirmed by the data-collator 13, then the deflection-controller 14 controls the deflection to allow the electron beam 2 to be transmitted toward the third aperture mask pattern 11c of the second aperture member 6, whereby the electron beam 2 is shaped in accordance with the shape of the third aperture mask pattern 11c. The electron beam 2 having passed through the third aperture mask pattern 11c of the second aperture member 6 is then irradiated onto the resist over the wafer "W" thereby to write the third type unit pattern P3 on the resist.

If the correspondence of the fourth type unit pattern P4 with the fourth aperture mask pattern 11d is confirmed by the data-collator 13, then the deflection-controller 14 controls the deflection to allow the electron beam 2 to be transmitted toward the fourth aperture mask pattern 11d of the second aperture member 6, whereby the electron beam 2 is shaped in accordance with the shape of the fourth aperture mask pattern 11d. The electron beam 2 having passed through the fourth aperture mask pattern 11d of the second aperture member 6 is then irradiated onto the resist over the wafer "W" thereby to write the fourth type unit pattern P4 on the resist.

If the correspondence of the fifth type unit pattern P5 with the fifth aperture mask pattern 11e is confirmed by the data-collator 13, then the deflection-controller 14 controls the deflection to allow the electron beam 2 to be transmitted toward the fifth aperture mask pattern 11e of the second aperture member 6, whereby the electron beam 2 is shaped in accordance with the shape of the fifth aperture mask pattern 11e. The electron beam 2 having passed through the fifth aperture mask pattern 11e of the second aperture member 6 is then irradiated onto the resist over the wafer "W" thereby to write the fifth type unit pattern P5 on the resist.

In a seventh step S17, if, however, no correspondence of the sixth type unit pattern P6 with any of the above five aperture mask patterns 11a, 11b, 11c, 11d and 11e is confirmed by the data-collator 13, then the deflection-controller 14 controls the deflection to allow the electron beam 2 to be transmitted toward the square-shaped second aperture 10 of the second aperture member 6, whereby the electron beam 2 is shaped by a combination of the first and second apertures in accordance with the same function as the normal variable shaped electron beam exposure system, for example, by a relative movement of the first and second aperture members 5 and 6.

The above sixth and seventh steps S16 and S17 will continue until all of the divided unit patterns are written to write all of the write-required patterns on the resist.

In accordance with the above present invention, a total number of the unit patterns divided from the six write-required patterns is remarkably reduced to seventeen, whilst the conventional system divides the six write-required patterns into thirty three unit patterns. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

Third Embodiment

Figure 8:
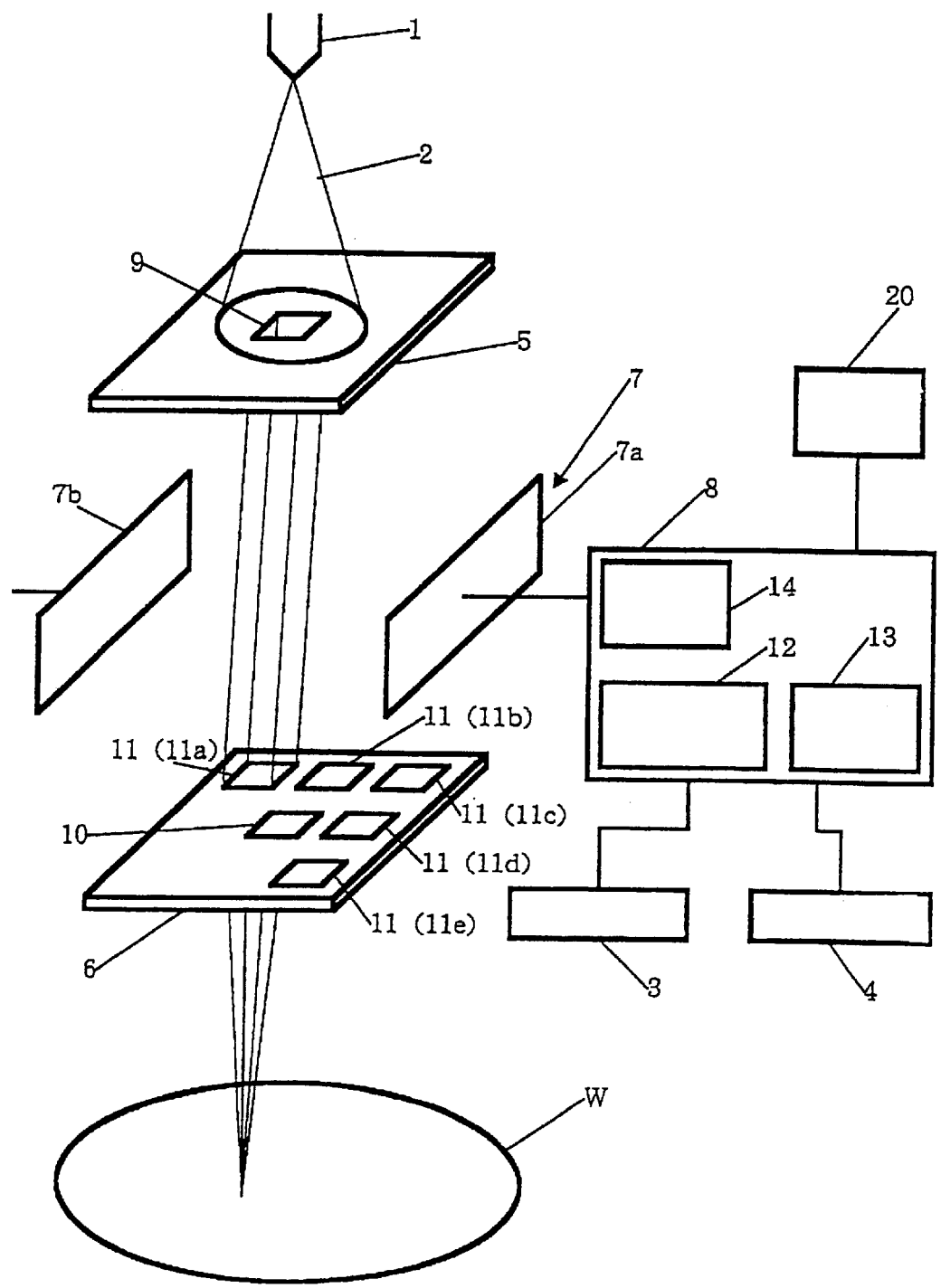
FIG. 8 is a schematic view illustrative of a novel variable shaped electron beam exposure system in a third embodiment in accordance with the present invention.

A third embodiment according to the present invention will be described in detail with reference to FIG. 8 which is a schematic view illustrative of a novel variable shaped electron beam exposure system. A difference of the third embodiment from the first embodiment is in further providing a storage medium which stores a computer program to be used for executing a control operation of the controller. An electron gum 1 is provided for emitting an electron beam 2. A pair of first and second aperture members 5 and 6 is positioned to have a distance in a direction along which the electron beam 2 is transmitted. The first and second aperture members have first and second apertures 9 and 10 for shaping the electron beam 2 so that the electron beam 2 is first transmitted through the first aperture 9 and then transmitted through the second aperture 10 for forming a variable shaped electron beam which will be irradiated onto a resist over a wafer "W". The first and second apertures 9 and 10 are square-shaped to have the same size as each other. The second aperture member 6 further has a set of five aperture mask patterns 11a, 11b, 11c, 11d, and 11e which differ in shape from each other. Each of the five aperture mask patterns 11a, 11b, 11c, 11d, and 11e has a size not larger than the first and second apertures 9 and 10. Namely, the five aperture mask patterns 11a, 11b, 11c, 11d, and 11e are formed within a square-shaped area which has the same definition as the first and second square-shaped apertures 9 and 10.

With reference to FIG. 4, the five aperture mask patterns 11a, 11b, 11c, 11d, and 11e comprise openings with predetermined shapes as represented by the real lines and are formed within square-shaped areas represented by broken lines The square-shaped areas have the same size as each other and as the second square-shaped aperture 10. The first, second and third aperture mask patterns 11a, 11b and 11c are aligned along a first side of the square-shaped second aperture member 6. The third, fourth and fifth aperture mask patterns 11c, 11d and 11e are aligned along a second side adjacent to the first side of the square-shaped second aperture member 6 so that the first and fifth aperture mask patterns 11a and 11e are positioned at opposite corners of the square-shaped second aperture member 6. The second aperture mask pattern 11a is formed at an intermediate position between the first and third aperture mask patterns 11a and 11c. The fourth aperture mask pattern 11d is formed at an intermediate position between the third and fifth aperture mask patterns 11c and 11e. The third aperture mask pattern 11c is positioned at the corner at which the first and second sides are crossed to each other at the right angle. The first aperture mask pattern 11a has a first-modified rectangle shape with a wide portion, which has a longitudinal axis extending in a first direction in parallel to the second side of the square-shaped second aperture member 6. The first aperture mask pattern 11a extends within the square-shaped area from one side to opposite side, both of which are distanced in the first direction. The wide portion is formed adjacent to the one side being closer to the first side of the square-shaped second aperture member 6. The first aperture mask pattern 11a is symmetrical with reference to the longitudinal axis thereof, which extends on a center of the square-shaped area. The second aperture mask pattern 11b has a second-modified rectangle shape with a wide portion, which has a longitudinal axis extending in a second direction in parallel to the first side of the square-shaped second aperture member 6. The second aperture mask pattern 11b extends within the square-shaped area from one side to opposite side, both of which are distanced in the second direction. The wide portion is formed adjacent to the one side being closer to the third aperture mask pattern 11b. The second aperture mask pattern 11b is symmetrical with reference to the longitudinal axis thereof, which extends on a center of the square-shaped area. The third aperture mask pattern 11c has a third-modified rectangle shape with a wide portion, which has a longitudinal axis extending in the first direction in parallel to the second side of the square-shaped second aperture member 6. The third aperture mask pattern 11c extends within the square-shaped area from one side to opposite side, both of which are distanced in the first direction. The wide portion is formed at the center of the third aperture mask pattern 11c or at the center of the square-shaped area. The third aperture mask pattern 11c is symmetrical with reference to both the longitudinal axis thereof and a short axis perpendicular to the longitudinal axis. The fourth aperture mask pattern 11d has a fourth-modified rectangle shape with a wide portion, which has a longitudinal axis extending in the first direction in parallel to the second side of the square-shaped second aperture member 6. The fourth aperture mask pattern 11d extends within the square-shaped area from one side to opposite side, both of which are distanced in the first direction. The wide portion is formed adjacent to the opposite side being closer to the fifth aperture mask pattern 11e. The fourth aperture mask pattern 11d is symmetrical with reference to the longitudinal axis thereof, which extends on a center of the square-shaped area. The fifth aperture mask pattern 11e has a pair of rectangles having longitudinal axes extending in the first direction in parallel to the second side of the square-shaped second aperture member 6. The paired rectangles of the fifth aperture mask pattern 11e extend within the square-shaped area from a first side to a second side opposite to the first side, wherein the first and second sides are distanced in the first direction. The paired rectangles of the fifth aperture mask pattern 11e also extend along a third side of the square-shaped area and a fourth side thereof opposite to the third side respectively, so that the paired rectangles of the fifth aperture mask pattern 11e are distanced from each other in the second direction in parallel to the first side of the square-shaped second aperture member 6. Namely, the paired rectangles of the fifth aperture mask pattern 11e extend to sandwich a rectangular-shaped center region having a longitudinal axis parallel to the first direction. The fifth aperture mask pattern 11e is symmetrical with reference to both the longitudinal axis thereof and a short axis perpendicular to the longitudinal axis.

With reference back to FIG. 3, a deflector 7 is provided between the first and second aperture members 5 and 6 for deflecting the electron beam 2 on the transmission between the first and second aperture members 5 and 6. The deflector 7 comprises a pair of deflecting electrode plates 7a and 7b for applying an electric field to a space between the paired deflecting electrode plates 7a and 7b, wherein the electron beam 2 having passed through the first aperture member 5 is transmitted through the space applied with the electric field by the paired deflecting electrode plates 7a and 7b whereby the electron beam 2 is deflected in accordance with the applied electric field. It is possible to control the deflection of the electron beam 2 by controlling the electric field applied to the electron beam. The electron beam having passed through the first square-shaped aperture 9 of the first aperture member 5 is so deflected by the deflector 7 as to be transmitted toward a selected one of the second square-shaped aperture 10 and the five aperture mask patterns 11a, 11b, 11c, 11d and 11e.

As a modification to the above deflector 7, it is also possible to deflect the electron beam by applying a magnetic field to the electron beam in place of the electric field.

A controller 8 is further provided which is connected to the deflector 7 for controlling the deflection by the deflector 7 to the electron beam 2 on the transmission between the first and second aperture members 5 and 6 The controller 8 includes a pattern-divider 12 being connected to a data memory 3 for reading data of write-required patterns out of the data memory 3 to divide each of the write-required patterns into a plurality of unit patterns.

A storage medium 20 is further provided which stores a computer program of processes for implementing a variable shaped electron beam exposure. The storage medium 20 is connected to the controller 8 for allowing the controller 8 to read the program out of the storage medium 20 for implementing the control operations of the controller 8.

With reference to FIG. 5, the divided seventeen unit patterns are classified into six types. There exist three of the first type unit pattern P1 which corresponds to the first aperture mask pattern 11a of the second aperture member 6 shown in FIG. 4. There exists one of the second type unit pattern P2 which corresponds to the second aperture mask pattern 11b of the second aperture member 6. There exists one of the third type unit pattern P3 which corresponds to the third aperture mask pattern 11c of the second aperture member 6. There exist three of the fourth type unit pattern P4 which corresponds to the fourth aperture mask pattern 11d of the second aperture member 6. There exists one of the fifth type unit pattern P5 which corresponds to the fifth aperture mask pattern 11e of the second aperture member 6. There exist eight of the sixth type unit pattern P6 which does not correspond to any of the five aperture mask patterns 11a, 11b, 11c, 11d and 11e of the second aperture member 6.

The controller 8 further includes a data-collator 13 being connected to the pattern-divider 12 for fetching the divided unit patterns and also connected to a buffer memory 4 for reading out data of the shape of the above five aperture mask patterns 11a, 11b, 11c, 11d and 11e so as to collate the unit patterns with the shapes of the above five aperture mask patterns 11a, 11b, 11c, 11d and 11e to confirm any correspondence between the unit patterns and the shape of any of the above five aperture mask patterns 11a, 11b, 11c, 11d and 11e. As a result of the collation, the data-collator 13 confirm the correspondences as follows. The first type unit patterns P1 correspond to the first aperture mask pattern 11a. The second type unit pattern P2 corresponds to the second aperture mask pattern 11b. The third type unit pattern P3 corresponds to the third aperture mask pattern 11c. The fourth type unit pattern P4 corresponds to the fourth aperture mask pattern 11d. The fifth type unit pattern P5 corresponds to the fifth aperture mask pattern 11e of the second aperture member 6. The sixth type unit patterns P6 do not correspond to any of the five aperture mask patterns 11a, 11b, 11c, 11d and 11e of the second aperture member 6.

The controller 8 further includes a deflection-controller 14 being connected to the data-collator 13 for fetching the results of the collations to control the electric field applied by the deflector 7 to the electron beam 2 in accordance with the result of the correspondence of the individual unit patterns with any of the five aperture mask patterns 11a, 11b, 11c, 11d and 11e.

If the correspondence of the first type unit pattern P1 with the first aperture mask pattern 11a is confirmed by the data-collator 13, then the deflection-controller 14 controls the deflection to allow the electron beam 2 to be transmitted toward the first aperture mask pattern 11a of the second aperture member 6, whereby the electron beam 2 is shaped in accordance with the shape of the first aperture mask pattern 11a. The electron beam 2 having passed through the first aperture mask pattern 11a of the second aperture member 6 is then irradiated onto the resist over the wafer "W" thereby to write the first type unit pattern P1 on the resist.

If the correspondence of the second type unit pattern P2 with the second aperture mask pattern 11b is confirmed by the data-collator 13, then the deflection-controller 14 controls the deflection to allow the electron beam 2 to be transmitted toward the second aperture mask pattern 11b of the second aperture member 6, whereby the electron beam 2 is shaped in accordance with the shape of the second aperture mask pattern 11b. The electron beam 2 having passed through the second aperture mask pattern 11b of the second aperture member 6 is then irradiated onto the resist over the wafer "W" thereby to write the second type unit pattern P2 on the resist.

If the correspondence of the third type unit pattern P3 with the third aperture mask pattern 11c is confirmed by the data-collator 13, then the deflection-controller 14 controls the deflection to allow the electron beam 2 to be transmitted toward the third aperture mask pattern 11c of the second aperture member 6, whereby the electron beam 2 is shaped in accordance with the shape of the third aperture mask pattern 11c. The electron beam 2 having passed through the third aperture mask pattern 11c of the second aperture member 6 is then irradiated onto the resist over the wafer "W" thereby to write the third type unit pattern P3 on the resist.

If the correspondence of the fourth type unit pattern P4 with the fourth aperture mask pattern 11d is confirmed by the data-collator 13, then the deflection-controller 14 controls the deflection to allow the electron beam 2 to be transmitted toward the fourth aperture mask pattern 11d of the second aperture member 6, whereby the electron beam 2 is shaped in accordance with the shape of the fourth aperture mask pattern 11d. The electron beam 2 having passed through the fourth aperture mask pattern 11d of the second aperture member 6 is then irradiated onto the resist over the wafer "W" thereby to write the fourth type unit pattern P4 on the resist.

If the correspondence of the fifth type unit pattern P5 with the fifth aperture mask pattern 11e is confirmed by the data-collator 13, then the deflection-controller 14 controls the deflection to allow the electron beam 2 to be transmitted toward the fifth aperture mask pattern 11e of the second aperture member 6, whereby the electron beam 2 is shaped in accordance with the shape of the fifth aperture mask pattern 11e. The electron beam 2 having passed through the fifth aperture mask pattern 11e of the second aperture member 6 is then irradiated onto the resist over the wafer "W" thereby to write the fifth type unit pattern P5 on the resist.

If, however, no correspondence of the sixth type unit pattern P6 with any of the above five aperture mask patterns 11a, 11b, 11c, 11d and 11e is confirmed by the data-collator 13, then the deflection-controller 14 controls the deflection to allow the electron beam 2 to be transmitted toward the square-shaped second aperture 10 of the second aperture member 6, whereby the electron beam 2 is shaped by a combination of the first and second apertures in accordance with the same function as the normal variable shaped electron beam exposure system, for example, by a relative movement of the first and second aperture members 5 and 6.

The following descriptions will focus on operations of the above novel variable shaped electron beam exposure system with reference again to FIG. 6. The controller 8 reads the computer program out of the storage medium 20 before the controller 8 is operated in accordance with the computer program.

In a first step S1, data of write-required patterns are read by the pattern-divider 12 out of the data memory 3.

In a second step S2, each of the write-required patterns is divided by the pattern-divider 12 into a plurality of unit patterns.

In a third step S3, data of the shape of the above five aperture mask patterns 11a, 11b, 11c, 11d and 11e are read by the data-collator 13 out of the buffer memory 3.

In a fourth step S4, the unit pattern is collated by the data-collator 13 with the shapes of the above five aperture mask patterns 11a, 11b, 11c, 11d and 11e to confirm any correspondence between the unit pattern and the shape of any of the above five aperture mask patterns 11a, 11b, 11c, 11d and 11e.

In a fifth step S5, the results of the collations are fetched by the deflection-controller 14 to control the electric field applied by the deflector 7 to the electron beam 2 in accordance with the result of the correspondence of the individual unit patterns with any of the five aperture mask patterns 11a, 11b, 11c, 11d and 11e.

If the correspondence of the first type unit pattern P1 with the first aperture mask pattern 11a is confirmed by the data-collator 13, then the deflection-controller 14 controls the deflection to allow the electron beam 2 to be transmitted toward the first aperture mask pattern 11a of the second aperture member 6, whereby the electron beam 2 is shaped in accordance with the shape of the first aperture mask pattern 11a. The electron beam 2 having passed through the first aperture mask pattern 11a of the second aperture member 6 is then irradiated onto the resist over the wafer "W" thereby to write the first type unit pattern P1 on the resist.

If the correspondence of the second type unit pattern P2 with the second aperture mask pattern 11b is confirmed by the data-collator 13, then the deflection-controller 14 controls the deflection to allow the electron beam 2 to be transmitted toward the second aperture mask pattern 11b of the second aperture member 6, whereby the electron beam 2 is shaped in accordance with the shape of the second aperture mask pattern 11b. The electron beam 2 having passed through the second aperture mask pattern 11b of the second aperture member 6 is then irradiated onto the resist over the wafer "W" thereby to write the second type unit pattern P2 on the resist.

If the correspondence of the third type unit pattern P3 with the third aperture mask pattern 11c is confirmed by the data-collator 13, then the deflection-controller 14 controls the deflection to allow the electron beam 2 to be transmitted toward the third aperture mask pattern 11c of the second aperture member 6, whereby the electron beam 2 is shaped in accordance with the shape of the third aperture mask pattern 11c. The electron beam 2 having passed through the third aperture mask pattern 11c of the second aperture member 6 is then irradiated onto the resist over the wafer "W" thereby to write the third type unit pattern P3 on the resist.

If the correspondence of the fourth type unit pattern P4 with the fourth aperture mask pattern 11d is confirmed by the data-collator 13, then the deflection-controller 14 controls the deflection to allow the electron beam 2 to be transmitted toward the fourth aperture mask pattern 11d of the second aperture member 6, whereby the electron beam 2 is shaped in accordance with the shape of the fourth aperture mask pattern 11d. The electron beam 2 having passed through the fourth aperture mask pattern 11d of the second aperture member 6 is then irradiated onto the resist over the wafer "W" thereby to write the fourth type unit pattern P4 on the resist.

If the correspondence of the fifth type unit pattern P5 with the fifth aperture mask pattern 11e is confirmed by the data-collator 13, then the deflection-controller 14 controls the deflection to allow the electron beam 2 to be transmitted toward the fifth aperture mask pattern 11e of the second aperture member 6, whereby the electron beam 2 is shaped in accordance with the shape of the fifth aperture mask pattern 11e. The electron beam 2 having passed through the fifth aperture mask pattern 11e of the second aperture member 6 is then irradiated onto the resist over the wafer "W" thereby to write the fifth type unit pattern P5 on the resist.

In a sixth step S6, if, however, no correspondence of the sixth type unit pattern P6 with any of the above five aperture mask patterns 11a, 11b, 11c, 11d and 11e is confirmed by the data-collator 13, then the deflection-controller 14 controls the deflection to allow the electron beam 2 to be transmitted toward the square-shaped second aperture 10 of the second aperture member 6, whereby the electron beam 2 is shaped by a combination of the first and second apertures in accordance with the same function as the normal variable shaped electron beam exposure system, for example, by a relative movement of the first and second aperture members 5 and 6.

In a seventh step S7, it is verified whether or not all of the divided unit patterns have been written to write all of the write-required patterns on the resist. If verified, the processes will end. If, however, any of the divided unit patterns have not yet been written on the resist, then the process will back to the above fourth step S4 so that the series of the fourth and fifth steps or the fourth and sixth steps will be repeated until all of the divided unit patterns have been written.

In accordance with the above present invention, a total number of the unit patterns divided from the six write-required patterns is remarkably reduced to seventeen, whilst the conventional system divides the six write-required patterns into thirty three unit patterns. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

Fourth Embodiment

Figure 9:
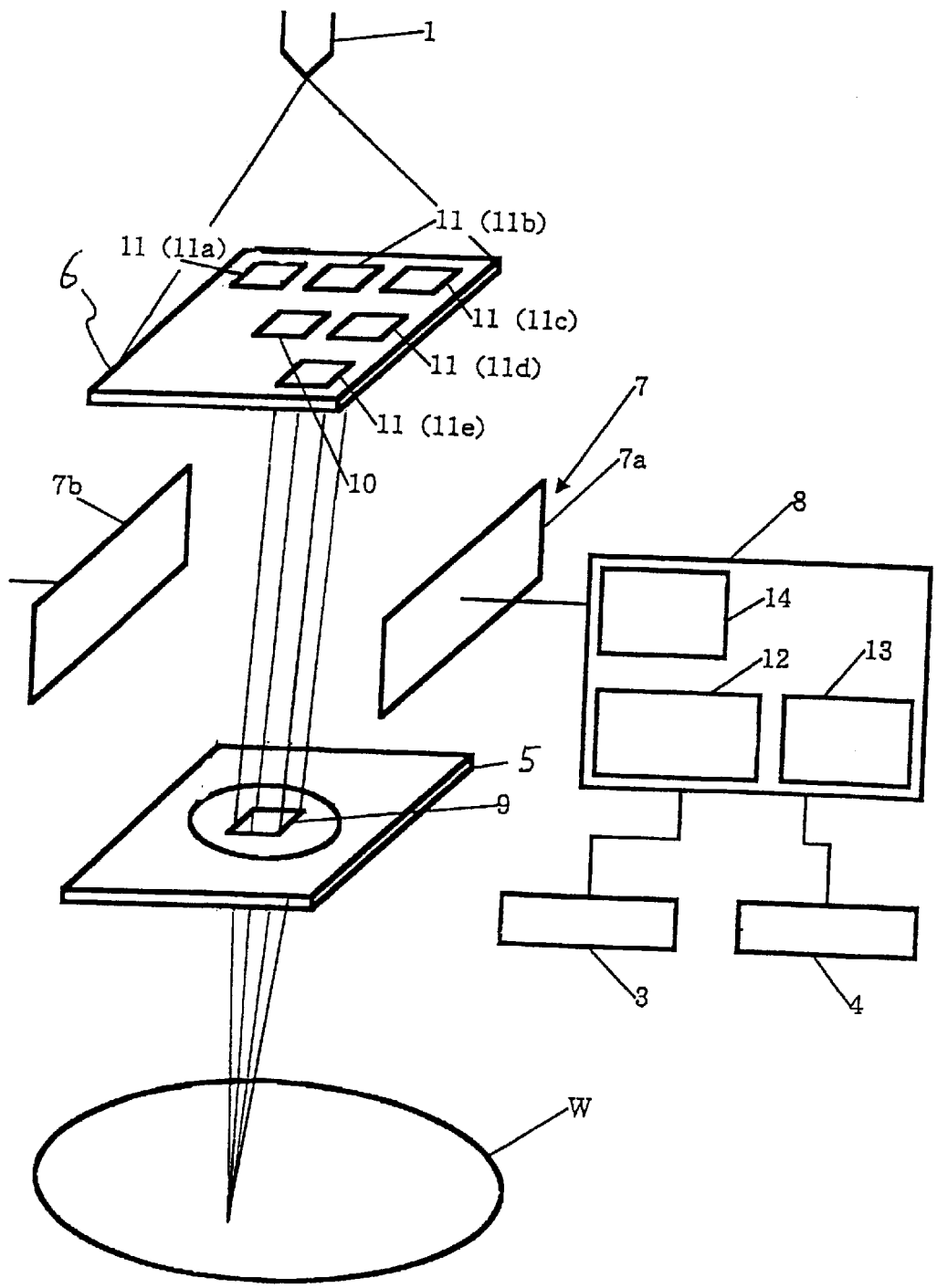
FIG. 9 is a schematic view illustrative of a novel variable shaped electron beam exposure system in fourth and fifth embodiments in accordance with the present invention.

A fourth embodiment according to the present invention will be described in detail With reference to FIG. 9 which is a schematic view illustrative of a novel variable shaped electron beam exposure system. An electron gum 1 is provided for emitting an electron beam 2. A pair of first and second aperture members 6 and 5 is positioned to have a distance in a direction along which the electron beam 2 is transmitted. The first and second aperture members 6 and 5 have first and second apertures 10 and 9 for shaping the electron beam 2 so that the electron beam 2 is first transmitted through the first aperture 10 and then transmitted through the second aperture 9 for forming a variable shaped electron beam which will be irradiated onto a resist over a wafer "W". The first and second apertures 10 and 9 are square-shaped to have the same size as each other. The first aperture member 6 further has a set of five aperture mask patterns 11a, 11b, 11c, 11d, and 11e which differ in shape from each other. Each of the five aperture mask patterns 11a, 11b, 11c, 11d, and 11e has a size not larger than the first and second apertures 9 and 10. Namely, the five aperture mask patterns 11a, 11b, 11c, 11d, and 11e are formed within a square-shaped area which has the same definition as the first and second square-shaped apertures 10 and 9.

With reference again to FIG. 4, the five aperture mask patterns 11a, 11b, 11c, 11d, and 11e comprise openings with predetermined shapes as represented by the real lines and are formed within square-shaped areas represented by broken lines. The square-shaped areas have the same size as each other and as the second square-shaped aperture 10. The first, second and third aperture mask patterns 11a, 11b and 11c are aligned along a first side of the square-shaped second aperture member 6. The third, fourth and fifth aperture mask patterns 11c, 11d and 11e are aligned along a second side adjacent to the first side of the square-shaped second aperture member 6 so that the first and fifth aperture mask patterns 11a and 11e are positioned at opposite corners of the square-shaped second aperture member 6. The second aperture mask pattern 11a is formed at an intermediate position between the first and third aperture mask patterns 11a and 11c. The fourth aperture mask pattern 11d is formed at an intermediate position between the third and fifth aperture mask patterns 11c and 11e. The third aperture mask pattern 11c is positioned at the corner at which the first and second sides are crossed to each other at the right angle. The first aperture mask pattern 11a has a first-modified rectangle shape with a wide portion, which has a longitudinal axis extending in a first direction in parallel to the second side of the square-shaped second aperture member 6. The first aperture mask pattern 11a extends within the square-shaped area from one side to opposite side, both of which are distanced in the first direction. The wide portion is formed adjacent to the one side being closer to the first side of the square-shaped second aperture member 6. The first aperture mask pattern 11a is symmetrical with reference to the longitudinal axis thereof, which extends on a center of the square-shaped area. The second aperture mask pattern 11b has a second-modified rectangle shape with a wide portion, which has a longitudinal axis extending in a second direction in parallel to the first side of the square-shaped second aperture member 6. The second aperture mask pattern 11b extends within the square-shaped area from one side to opposite side, both of which are distanced in the second direction. The wide portion is formed adjacent to the one side being closer to the third aperture mask pattern 11b. The second aperture mask pattern 11b is symmetrical with reference to the longitudinal axis thereof, which extends on a center of the square-shaped area. The third aperture mask pattern 11c has a third-modified rectangle shape with a wide portion, which has a longitudinal axis extending in the first direction in parallel to the second side of the square-shaped second aperture member 6. The third aperture mask pattern 11c extends within the square-shaped area from one side to opposite side, both of which are distanced in the first direction. The wide portion is formed at the center of the third aperture mask pattern 11c or at the center of the square-shaped area. The third aperture mask pattern 11c is symmetrical with reference to both the longitudinal axis thereof and a short axis perpendicular to the longitudinal axis. The fourth aperture mask pattern 11d has a fourth-modified rectangle shape with a wide portion, which has a longitudinal axis extending in the first direction in parallel to the second side of the square-shaped second aperture member 6. The fourth aperture mask pattern 11d extends within the square-shaped area from one side to opposite side, both of which are distanced in the first direction, The wide portion is formed adjacent to the opposite side being closer to the fifth aperture mask pattern 11e. The fourth aperture mask pattern 11d is symmetrical with reference to the longitudinal axis thereof, which extends on a center of the square-shaped area. The fifth aperture mask pattern 11e has a pair of rectangles having longitudinal axes extending in the first direction in parallel to the second side of the square-shaped second aperture member 6. The paired rectangles of the fifth aperture mask pattern 11e extend within the square-shaped area from a first side to a second side opposite to the first side, wherein the first and second sides are distanced in the first direction. The paired rectangles of the fifth aperture mask pattern 11e also extend along a third side of the square-shaped area and a fourth side thereof opposite to the third side respectively, so that the paired rectangles of the fifth aperture mask pattern 11e are distanced from each other in the second direction in parallel to the first side of the square-shaped second aperture member 6. Namely, the paired rectangles of the fifth aperture mask pattern 11e extend to sandwich a rectangular-shaped center region having a longitudinal axis parallel to the first direction. The fifth aperture mask pattern 11e is symmetrical with reference to both the longitudinal axis thereof and a short axis perpendicular to the longitudinal axis.

With reference back to FIG. 9, a deflector 7 is provided between the first and second aperture members 6 and 5 for deflecting the electron beam 2 on the transmission between the first and second aperture members 6 and 5. The deflector 7 comprises a pair of deflecting electrode plates 7a and 7b for applying an electric field to a space between the paired deflecting electrode plates 7a and 7b, wherein the electron beam 2 having passed through the first aperture member 6 is transmitted through the space applied with the electric field by the paired deflecting electrode plates 7a and 7b whereby the electron beam 2 is deflected in accordance with the applied electric field. It is possible to control the deflection of the electron beam 2 by controlling the electric field applied to the electron beam. The electron beams having passed through the first square-shaped aperture 10 and the five aperture mask patterns 11a, 11b, 11c, 11d and 11e of the first aperture member 6 are so deflected by the deflector 7 as to cause a selected one of the electron beams having passed through the first square-shaped aperture 10 and the five aperture mask patterns 11a, 11b, 11c, 11d and 11e to be transmitted toward the second square-shaped aperture 9 of the second aperture member 5.

As a modification to the above deflector 7, it is also possible to deflect the electron beam by applying a magnetic field to the electron beam in place of the electric field.

A controller 8 is further provided which is connected to the deflector 7 for controlling the deflection by the deflector 7 to the electron beam 2 on the transmission between the first and second aperture members 6 and 5. The controller 8 includes a pattern-divider 12 being connected to a data memory 3 for reading data of write-required patterns out of the data memory 3 to divide each of the write-required patterns into a plurality of unit patterns.

With reference again to FIG. 5, the divided seventeen unit patterns are classified into six types. There exist three of the first type unit pattern P1 which corresponds to the first aperture mask pattern 11a of the second aperture member 6 shown in FIG. 4. There exists one of the second type unit pattern P2 which corresponds to the second aperture mask pattern 11b of the first aperture member 6. There exists one of the third type unit pattern P3 which corresponds to the third aperture mask pattern 11c of the second aperture member 6. There exist three of the fourth type unit pattern P4 which corresponds to the fourth aperture mask pattern 11d of the second aperture member 6. There exists one of the fifth type unit pattern P5 which corresponds to the fifth aperture mask pattern 11e of the second aperture member 6. There exist eight of the sixth type unit pattern P6 which does not correspond to any of the five aperture mask patterns 11a, 11b, 11c, 11d and 11e of the second aperture member 6.

The controller 8 further includes a data-collator 13 being connected to the pattern-divider 12 for fetching the divided unit patterns and also connected to a buffer memory 4 for reading out data of the shape of the above five aperture mask patterns 11a, 11b, 11c, 11d and 11e so as to collate the unit patterns with the shapes of the above five aperture mask patterns 11a, 11b, 11c, 11d and 11e to confirm any correspondence between the unit patterns and the shape of any of the above five aperture mask patterns 11a, 11b, 11c, 11d and 11e. As a result of the collation, the data-collator 13 confirm the correspondences as follows. The first type unit patterns P1 correspond to the first aperture mask pattern 11a. The second type unit pattern P2 corresponds to the second aperture mask pattern 11b. The third type unit pattern P3 corresponds to the third aperture mask pattern 11c. The fourth type unit pattern P4 corresponds to the fourth aperture mask pattern 11d. The fifth type unit pattern P5 corresponds to the fifth aperture mask pattern 11e of the first aperture member 6. The sixth type unit patterns P6 do not correspond to any of the five aperture mask patterns 11a, 11b, 11c, 11d and 11e of the first aperture member 6.

The controller 8 further includes a deflection-controller 14 being connected to the data-collator 13 for fetching the results of the collations to control the electric field applied by the deflector 7 to the electron beam 2 in accordance with the result of the correspondence of the individual unit patterns with any of the five aperture mask patterns 11a, 11b, 11c, 11d and 11e.

If the correspondence of the first type unit pattern P1 with the first aperture mask pattern 11a is confirmed by the data-collator 13, then the deflection-controller 14 controls the deflection to allow that the electron beam 2 having passed through the first aperture mask pattern 11a of the first aperture member 6 is transmitted toward the second square-shaped aperture 9 of the second aperture member 5, whereby the electron beam 2 is shaped in accordance with the shape of the first aperture mask pattern 11a. The electron beam 2 having been defined by the first aperture mask pattern 11a of the first aperture member 6 is therefore irradiated onto the resist over the wafer "W" thereby to write the first type unit pattern P1 on the resist.

If the correspondence of the second type unit pattern P2 with the second aperture mask pattern 11b is confirmed by the data-collator 13, then the deflection-controller 14 controls the deflection to allow that the electron beam 2 having passed through the second aperture mask pattern 11b of the first aperture member 6 is transmitted toward the second square-shaped aperture 9 of the second aperture member 5, whereby the electron beam 2 is shaped in accordance with the shape of the second aperture mask pattern 11b. The electron beam 2 having been defined by the second aperture mask pattern 11b of the first aperture member 6 is therefore irradiated onto the resist over the wafer "W" thereby to write the second type unit pattern P2 on the resist.

If the correspondence of the third type unit pattern P3 with the third aperture mask pattern 11c is confirmed by the data-collator 13, then the deflection-controller 14 controls the deflection to allow that the electron beam 2 having passed through the third aperture mask pattern 11c of the first aperture member 6 is transmitted toward the second square-shaped aperture 9 of the second aperture member 5, whereby the electron beam 2 is shaped in accordance with the shape of the third aperture mask pattern 11c. The electron beam 2 having been defined by the third aperture mask pattern 11c of the first aperture member 6 is therefore irradiated onto the resist over the wafer "W" thereby to write the third type unit pattern P3 on the resist.

If the correspondence of the fourth type unit pattern P4 with the fourth aperture mask pattern 11d is confirmed by the data-collator 13, then the deflection-controller 14 controls the deflection to allow that the electron beam 2 having passed through the fourth aperture mask pattern 11d of the first aperture member 6 is transmitted toward the second square-shaped aperture 9 of the second aperture member 5, whereby the electron beam 2 is shaped in accordance with the shape of the fourth aperture mask pattern 11d. The electron beam 2 having been defined by the fourth aperture mask pattern 11d of the first aperture member 6 is therefore irradiated onto the resist over the wafer "W" thereby to write the fourth type unit pattern P4 on the resist.

If the correspondence of the fifth type unit pattern P5 with the fifth aperture mask pattern 11e is confirmed by the data-collator 13, then the deflection-controller 14 controls the deflection to allow that the electron beam 2 having passed through the fifth aperture mask pattern 11e of the first aperture member 6 is transmitted toward the second square-shaped aperture 9 of the second aperture member 5, whereby the electron beam 2 is shaped in accordance with the shape of the fifth aperture mask pattern 11e. The electron beam 2 having been defined by the fifth aperture mask pattern 11e of the first aperture member 6 is therefore irradiated onto the resist over the wafer "W" thereby to write the fifth type unit pattern P5 on the resist.

If, however, no correspondence of the sixth type unit pattern P6 with any of the above five aperture mask patterns 11a, 11b, 11c, 11d and 11e is confirmed by the data-collator 13, then the deflection-controller 14 controls the deflection to allow that the electron beam 2 having passed through the first square-shaped aperture 10 is transmitted toward the square-shaped second aperture 10 of the second aperture member 6, whereby the electron beam 2 is shaped by a combination of the first and second apertures 10 and 9 in accordance with the same function as the normal variable shaped electron beam exposure system, for example, by a relative movement of the first and second aperture members 6 and 5.

The following descriptions will focus on operations of the above novel variable shaped electron beam exposure system with reference again to FIG. 6.

In a first step S1, data of write-required patterns are read by the pattern-divider 12 out of the data memory 3.

In a second step S2, each of the write-required patterns is divided by the pattern-divider 12 into a plurality of unit patterns.

In a third step S3, data of the shape of the above five aperture mask patterns 11a, 11b, 11c, 11d and 11e are read by the data-collator 13 out of the buffer memory 3.

In a fourth step S4, the unit pattern is collated by the data-collator 13 with the shapes of the above five aperture mask patterns 11a, 11b, 11c, 11d and 11e to confirm any correspondence between the unit pattern and the shape of any of the above five aperture mask patterns 11a, 11b, 11c, 11d and 11e.

In a fifth step S5, the results of the collations are fetched by the deflection-controller 14 to control the electric field applied by the deflector 7 to the electron beam 2 in accordance with the result of the correspondence of the individual unit patterns with any of the five aperture mask patterns 11a, 11b, 11c, 11d and 11e.

If the correspondence of the first type unit pattern P1 with the first aperture mask pattern 11a is confirmed by the data-collator 13, then the deflection-controller 14 controls the deflection to allow that the electron beam 2 having passed through the first aperture mask pattern 11a of the first aperture member 6 is transmitted toward the second square-shaped aperture 9 of the second aperture member 5, whereby the electron beam 2 is shaped in accordance with the shape of the first aperture mask pattern 11a. The electron beam 2 having been defined by the first aperture mask pattern 11a of the first aperture member 6 is therefore irradiated onto the resist over the wafer "W" thereby to write the first type unit pattern P1 on the resist.

If the correspondence of the second type unit pattern P2 with the second aperture mask pattern 11b is confirmed by the data-collator 13, then the deflection-controller 14 controls the deflection to allow that the electron beam 2 having passed through the second aperture mask pattern 11b of the first aperture member 6 is transmitted toward the second square-shaped aperture 9 of the second aperture member 5, whereby the electron beam 2 is shaped in accordance with the shape of the second aperture mask pattern 11b. The electron beam 2 having been defined by the second aperture mask pattern 11b of the first aperture member 6 is therefore irradiated onto the resist over the wafer "W" thereby to write the second type unit pattern P2 on the resist.

If the correspondence of the third type unit pattern P3 with the third aperture mask pattern 11c is confirmed by the data-collator 13, then the deflection-controller 14 controls the deflection to allow that the electron beam 2 having passed through the third aperture mask pattern 11c of the first aperture member 6 is transmitted toward the second square-shaped aperture 9 of the second aperture member 5, whereby the electron beam 2 is shaped in accordance with the shape of the third aperture mask pattern 11c. The electron beam 2 having been defined by the third aperture mask pattern 11c of the first aperture member 6 is therefore irradiated onto the resist over the wafer "W" thereby to write the third type unit pattern P3 on the resist.

If the correspondence of the fourth type unit pattern P4 with the fourth aperture mask pattern 11d is confirmed by the data-collator 13, then the deflection-controller 14 controls the deflection to allow that the electron beam 2 having passed through the fourth aperture mask pattern 11d of the first aperture member 6 is transmitted toward the second square-shaped aperture 9 of the second aperture member 5, whereby the electron beam 2 is shaped in accordance with the shape of the fourth aperture mask pattern 11d. The electron beam 2 having been defined by the fourth aperture mask pattern 11d of the first aperture member 6 is therefore irradiated onto the resist over the wafer "W" thereby to write the fourth type unit pattern P4 on the resist.

If the correspondence of the fifth type unit pattern P5 with the fifth aperture mask pattern 11e is confirmed by the data-collator 13, then the deflection-controller 14 controls the deflection to allow that the electron beam 2 having passed through the fifth aperture mask pattern 11e of the first aperture member 6 is transmitted toward the second square-shaped aperture 9 of the second aperture member 5, whereby the electron beam 2 is shaped in accordance with the shape of the fifth aperture mask pattern 11e. The electron beam 2 having been defined by the fifth aperture mask pattern 11e of the first aperture member 6 is therefore irradiated onto the resist over the wafer "W" thereby to write the fifth type unit pattern P5 on the resist.

In a sixth step S6, if, however, no correspondence of the sixth type unit pattern P6 with any of the above five aperture mask patterns 11a, 11b, 11c, 11d and 11e is confirmed by the data-collator 13, then the deflection-controller 14 controls the deflection to allow that the electron beam 2 having passed through the first square-shaped aperture 10 is transmitted toward the square-shaped second aperture 10 of the second aperture member 6, whereby the electron beam 2 is shaped by a combination of the first and second apertures 10 and 9 in accordance with the same function as the normal variable shaped electron beam exposure system, for example, by a relative movement of the first and second aperture members 6 and 5.

In a seventh step S7, it is verified whether or not all of the divided unit patterns have been written to write all of the write-required patterns on the resist. If verified, the processes will end. If, however, any of the divided unit patterns have not yet been written on the resist, then the process will back to the above fourth step S4 so that the series of the fourth and fifth steps or the fourth and sixth steps will be repeated until all of the divided unit patterns have been written.

In accordance with the above present invention, a total number of the unit patterns divided from the six write-required patterns is remarkably reduced to seventeen, whilst the conventional system divides the six write-required patterns into thirty three unit patterns. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

Fifth Embodiment

A fifth embodiment according to the present invention will be described in detail with reference to FIG. 9. A difference of the fifth embodiment from the fourth embodiment is in an operation of the controller for controlling the deflection. An electron gum 1 is provided for emitting an electron beam 2. A pair of first and second aperture members 6 and 5 is positioned to have a distance in a direction along which the electron beam 2 is transmitted. The first and second aperture members 6 and 5 have first and second apertures 10 and 9 for shaping the electron beam 2 so that the electron beam 2 is first transmitted through the first aperture 10 and then transmitted through the second aperture 9 for forming a variable shaped electron beam which will be irradiated onto a resist over a wafer "W". The first and second apertures 10 and 9 are square-shaped to have the same size as each other. The first aperture member 6 further has a set of five aperture mask patterns 11a, 11b, 11c, 11d, and 11e which differ in shape from each other. Each of the five aperture mask patterns 11a, 11b, 11c, 11d, and 11e has a size not larger than the first and second apertures 9 and 10. Namely, the five aperture mask patterns 11a, 11b, 11c, 11d, and 11e are formed within a square-shaped area which has the same definition as the first and second square-shaped apertures 10 and 9.

With reference again to FIG. 4, the five aperture mask patterns 11a, 11b, 11c, 11d, and 11e comprise openings with predetermined shapes as represented by the real lines and are formed within square-shaped areas represented by broken lines. The square-shaped areas have the same size as each other and as the second square-shaped aperture 10. The first, second and third aperture mask patterns 11a, 11b and 11c are aligned along a first side of the square-shaped second aperture member 6. The third, fourth and fifth aperture mask patterns 11c, 11d and 11e are aligned along a second side adjacent to the first side of the square-shaped second aperture member 6 so that the first and fifth aperture mask patterns 11a and 11e are positioned at opposite corners of the square-shaped second aperture member 6. The second aperture mask pattern 11a, is formed at an intermediate position between the first and third aperture mask patterns 11a and 11c. The fourth aperture mask pattern 11d is formed at an intermediate position between the third and fifth aperture mask patterns 11c and 11e. The third aperture mask pattern 11c is positioned at the corner at which the first and second sides are crossed to each other at the right angle. The first aperture mask pattern 11a has a first-modified rectangle shape with a wide portion, which has a longitudinal axis extending in a first direction in parallel to the second side of the square-shaped second aperture member 6. The first aperture mask pattern 11a extends within the square-shaped area from one side to opposite side, both of which are distanced in the first direction. The wide portion is formed adjacent to the one side being closer to the first side of the square-shaped second aperture member 6. The first aperture mask pattern 11a is symmetrical with reference to the longitudinal axis thereof, which extends on a center of the square-shaped area. The second aperture mask pattern 11b has a second-modified rectangle shape with a wide portion, which has a longitudinal axis extending in a second direction in parallel to the first side of the square-shaped second aperture member 6. The second aperture mask pattern 11b extends within the square-shaped area from one side to opposite side, both of which are distanced in the second direction. The wide portion is formed adjacent to the one side being closer to the third aperture mask pattern 11b. The second aperture mask pattern 11b is symmetrical with reference to the longitudinal axis thereof, which extends on a center of the square-shaped area. The third aperture mask pattern 11c has a third-modified rectangle shape with a wide portion, which has a longitudinal axis extending in the first direction in parallel to the second side of the square-shaped second aperture member 6. The third aperture mask pattern 11c extends within the square-shaped area from one side to opposite side, both of which are distanced in the first direction. The wide portion is formed at the center of the third aperture mask pattern 11c or at the center of the square-shaped area. The third aperture mask pattern 11c is symmetrical with reference to both the longitudinal axis thereof and a short axis perpendicular to the longitudinal axis. The fourth aperture mask pattern 11d has a fourth-modified rectangle shape with a wide portion, which has a longitudinal axis extending in the first direction in parallel to the second side of the square-shaped second aperture member 6. The fourth aperture mask pattern 11d extends within the square-shaped area from one side to opposite side, both of which are distanced in the first direction. The wide portion is formed adjacent to the opposite side being closer to the fifth aperture mask pattern 11e. The fourth aperture mask pattern 11d is symmetrical with reference to the longitudinal axis thereof, which extends on a center of the square-shaped area. The fifth aperture mask pattern 11e has a pair of rectangles having longitudinal axes extending in the first direction in parallel to the second side of the square-shaped second aperture member 6. The paired rectangles of the fifth aperture mask pattern 11e extend within the square-shaped area from a first side to a second side opposite to the first side, wherein the first and second sides are distanced in the first direction. The paired rectangles of the fifth aperture mask pattern 11e also extend along a third side of the square-shaped area and a fourth side thereof opposite to the third side respectively, so that the paired rectangles of the fifth aperture mask pattern 11e are distanced from each other in the second direction in parallel to the first side of the square-shaped second aperture member 6. Namely, the paired rectangles of the fifth aperture mask pattern 11e extend to sandwich a rectangular-shaped center region having a longitudinal axis parallel to the first direction. The fifth aperture mask pattern 11e is symmetrical with reference to both the longitudinal axis thereof and a short axis perpendicular to the longitudinal axis.

With reference back to FIG. 9, a deflector 7 is provided between the first and second aperture members 6 and 5 for deflecting the electron beam 2 on the transmission between the first and second aperture members 6 and 5. The deflector 7 comprises a pair of deflecting electrode plates 7a and 7b for applying an electric field to a space between the paired deflecting electrode plates 7a and 7b, wherein the electron beam 2 having passed through the first aperture member 6 is transmitted through the space applied with the electric field by the paired deflecting electrode plates 7a and 7b whereby the electron beam 2 is deflected in accordance with the applied electric field. It is possible to control the deflection of the electron beam 2 by controlling the electric field applied to the electron beam. The electron beams having passed through the first square-shaped aperture 10 and the five aperture mask patterns 11a, 11b, 11c, 11d and 11e of the first aperture member 6 are so deflected by the deflector 7 as to cause a selected one of the electron beams having passed through the first square-shaped aperture 10 and the five aperture mask patterns 11a, 11b, 11c, 11d and 11e to be transmitted toward the second square-shaped aperture 9 of the second aperture member 5.

As a modification to the above deflector 7, it is also possible to deflect the electron beam by applying a magnetic field to the electron beam in place of the electric field.

A controller 8 is further provided which is connected to the deflector 7 for controlling the deflection by the deflector 7 to the electron beam 2 on the transmission between the first and second aperture members 6 and 5. The controller 8 includes a pattern-divider 12 being connected to a data memory 3 for reading data of write-required patterns out of the data memory 3 to divide each of the write-required patterns into a plurality of unit patterns.

With reference again to FIG. 5, the divided seventeen unit patterns are classified into six types. There exist three of the first type unit pattern P1 which corresponds to the first aperture mask pattern 11a of the second aperture member 6 shown in FIG. 4. There exists one of the second type unit pattern P2 which corresponds to the second aperture mask pattern 11b of the first aperture member 6. There exists one of the third type unit pattern P3 which corresponds to the third aperture mask pattern 11c of the second aperture member 6. There exist three of the fourth type unit pattern P4 which corresponds to the fourth aperture mask pattern 11d of the second aperture member 6. There exists one of the fifth type unit pattern P5 which corresponds to the fifth aperture mask pattern 11e of the second aperture member 6. There exist eight of the sixth type unit pattern P6 which does not correspond to any of the five aperture mask patterns 11a, 11b, 11c, 11d and 11e of the second aperture member 6.

The controller 8 further includes a data-collator 13 being connected to the pattern-divider 12 for fetching the divided unit patterns and also connected to a buffer memory 4 for reading out data of the shape of the above five aperture mask patterns 11a, 11b, 11c, 11d and 11e so as to collate the unit patterns with the shapes of the above five aperture mask patterns 11a, 11b, 11c, 11d and 11e to confirm any correspondence between the unit patterns and the shape of any of the above five aperture mask patterns 11a, 11b, 11c, 11d and 11e. As a result of the collation, the data-collator 13 confirm the correspondences as follows. The first type unit patterns P1 correspond to the first aperture mask pattern 11a. The second type unit pattern P2 corresponds to the second aperture mask pattern 11b. The third type unit pattern P3 corresponds to the third aperture mask pattern 11c. The fourth type unit pattern P4 corresponds to the fourth aperture mask pattern 11d. The fifth type unit pattern P5 corresponds to the fifth aperture mask pattern 11e of the first aperture member 6. The sixth type unit patterns P6 do not correspond to any of the five aperture mask patterns 11a, 11b, 11c, 11d and 11e of the first aperture member 6.

The controller 8 further includes a deflection-controller 14 being connected to the data-collator 13 for fetching the results of the collations to control the electric field applied by the deflector 7 to the electron beam 2 in accordance with the result of the correspondence of the individual unit patterns with any of the five aperture mask patterns 11a, 11b, 11c, 11d and 11e.

If the correspondence of the first type unit pattern P1 with the first aperture mask pattern 11a is confirmed by the data-collator 13, then the deflection-controller 14 controls the deflection to allow that the electron beam 2 having passed through the first aperture mask pattern 11a of the first aperture member 6 is transmitted toward the second square-shaped aperture 9 of the second aperture member 5, whereby the electron beam 2 is shaped in accordance with the shape of the first aperture mask pattern 11a. The electron beam 2 having been defined by the first aperture mask pattern 11a of the first aperture member 6 is therefore irradiated onto the resist over the wafer "W" thereby to write the first type unit pattern P1 on the resist.

If the correspondence of the second type unit pattern P2 with the second aperture mask pattern 11b is confirmed by the data-collator 13, then the deflection-controller 14 controls the deflection to allow that the electron beam 2 having passed through the second aperture mask pattern 11b of the first aperture member 6 is transmitted toward the second square-shaped aperture 9 of the second aperture member 5, whereby the electron beam 2 is shaped in accordance with the shape of the second aperture mask pattern 11b. The electron beam 2 having been defined by the second aperture mask pattern 11b of the first aperture member 6 is therefore irradiated onto the resist over the wafer "W" thereby to write the second type unit pattern P2 on the resist.

If the correspondence of the third type unit pattern P3 with the third aperture mask pattern 11c is confirmed by the data-collator 13, then the deflection-controller 14 controls the deflection to allow that the electron beam 2 having passed through the third aperture mask pattern 11c of the first aperture member 6 is transmitted toward the second square-shaped aperture 9 of the second aperture member 5, whereby the electron beam 2 is shaped in accordance with the shape of the third aperture mask pattern 11c. The electron beam 2 having been defined by the third aperture mask pattern 11c of the first aperture member 6 is therefore irradiated onto the resist over the wafer "W" thereby to write the third type unit pattern P3 on the resist.

If the correspondence of the fourth type unit pattern P4 with the fourth aperture mask pattern 11d is confirmed by the data-collator 13, then the deflection-controller 14 controls the deflection to allow that the electron beam 2 having passed through the fourth aperture mask pattern 11d of the first aperture member 6 is transmitted toward the second square-shaped aperture 9 of the second aperture member 5, whereby the electron beam 2 is shaped in accordance with the shape of the fourth aperture mask pattern 11d. The electron beam 2 having been defined by the fourth aperture mask pattern 11d of the first aperture member 6 is therefore irradiated onto the resist over the wafer "W" thereby to write the fourth type unit pattern P4 on the resist.

If the correspondence of the fifth type unit pattern P5 with the fifth aperture mask pattern 11e is confirmed by the data-collator 13, then the deflection-controller 14 controls the deflection to allow that the electron beam 2 having passed through the fifth aperture mask pattern 11e of the first aperture member 6 is transmitted toward the second square-shaped aperture 9 of the second aperture member 5, whereby the electron beam 2 is shaped in accordance with the shape of the fifth aperture mask pattern 11e. The electron beam 2 having been defined by the fifth aperture mask pattern 11e of the first aperture member 6 is therefore irradiated onto the resist over the wafer "W" thereby to write the fifth type unit pattern P5 on the resist.

If, however, no correspondence of the sixth type unit pattern P6 with any of the above five aperture mask patterns 11a, 11b, 11c, 11d and 11e is confirmed by the data-collator 13, then the deflection-controller 14 controls the deflection to allow that the electron beam 2 having passed through the first square-shaped aperture 10 is transmitted toward the square-shaped second aperture 10 of the second aperture member 6, whereby the electron beam 2 is shaped by a combination of the first and second apertures 10 and 9 in accordance with the same function as the normal variable shaped electron beam exposure system, for example, by a relative movement of the first and second aperture members 6 and 5

The following descriptions will focus on operations of the above novel variable shaped electron beam exposure system with reference again to FIG. 7.

In a first step S11, data of write-required patterns are read by the pattern-divider 12 out of the data memory 3.

In a second step S12, each of the write-required patterns is divided by the pattern-divider 12 into a plurality of unit patterns.

In a third step S13, data of the shape of the above five aperture mask patterns 11a, 11b, 11c, 11d and 11e are read by the data-collator 13 out of the buffer memory 3.

In a fourth step S14, the unit pattern is collated by the data-collator 13 with the shapes of the above five aperture mask patterns 11a, 11b, 11c, 11d and 11e to confirm any correspondence between the unit pattern and the shape of any of the above five aperture mask patterns 11a, 11b, 11c, 11d and 11e.

In a fifth step S15, it is verified whether or not all of the divided unit patterns have been collated. If verified, the processes will enter into the following step. If, however, any of the divided unit patterns have not yet been collated, then the above fourth step of collation will be repeated until all of the divided unit patterns have been collated.

In a sixth step S16, the results of the collations are fetched by the deflection-controller 14 to control the electric field applied by the deflector 7 to the electron beam 2 in accordance with the result of the correspondences of the individual unit patterns with any of the five aperture mask patterns 11a, 11b, 11c, 11d and 11e.

If the correspondence of the first type unit pattern P1 with the first aperture mask pattern 11a is confirmed by the data-collator 13, then the deflection-controller 14 controls the deflection to allow that the electron beam 2 having passed through the first aperture mask pattern 11a of the first aperture member 6 is transmitted toward the second square-shaped aperture 9 of the second aperture member 5, whereby the electron beam 2 is shaped in accordance with the shape of the first aperture mask pattern 11a. The electron beam 2 having been defined by the first aperture mask pattern 11a of the first aperture member 6 is therefore irradiated onto the resist over the wafer "W" thereby to write the first type unit pattern P1 on the resist.

If the correspondence of the second type unit pattern P2 with the second aperture mask pattern 11b is confirmed by the data-collator 13, then the deflection-controller 14 controls the deflection to allow that the electron beam 2 having passed through the second aperture mask pattern 11b of the first aperture member 6 is transmitted toward the second square-shaped aperture 9 of the second aperture member 5, whereby the electron beam 2 is shaped in accordance with the shape of the second aperture mask pattern 11b. The electron beam 2 having been defined by the second aperture mask pattern 11b of the first aperture member 6 is therefore irradiated onto the resist over the wafer "W" thereby to write the second type unit pattern P2 on the resist.

If the correspondence of the third type unit pattern P3 with the third aperture mask pattern 11c is confirmed by the data-collator 13, then the deflection-controller 14 controls the deflection to allow that the electron beam 2 having passed through the third aperture mask pattern 11c of the first aperture member 6 is transmitted toward the second square-shaped aperture 9 of the second aperture member 5, whereby the electron beam 2 is shaped in accordance with the shape of the third aperture mask pattern 11c. The electron beam 2 having been defined by the third aperture mask pattern 11c of the first aperture member 6 is therefore irradiated onto the resist over the wafer "W" thereby to write the third type unit pattern P3 on the resist.

If the correspondence of the fourth type unit pattern P4 with the fourth aperture mask pattern 11d is confirmed by the data-collator 13, then the deflection-controller 14 controls the deflection to allow that the electron beam 2 having passed through the fourth aperture mask pattern 11d of the first aperture member 6 is transmitted toward the second square-shaped aperture 9 of the second aperture member 5, whereby the electron beam 2 is shaped in accordance with the shape of the fourth aperture mask pattern 11d. The electron beam 2 having been defined by the fourth aperture mask pattern 11d of the first aperture member 6 is therefore irradiated onto the resist over the wafer "W" thereby to write the fourth type unit pattern P4 on the resist.

If the correspondence of the fifth type unit pattern P5 with the fifth aperture mask pattern 11e is confirmed by the data-collator 13, then the deflection-controller 14 controls the deflection to allow that the electron beam 2 having passed through the fifth aperture mask pattern 11e of the first aperture member 6 is transmitted toward the second square-shaped aperture 9 of the second aperture member 5, whereby the electron beam 2 is shaped in accordance with the shape of the fifth aperture mask pattern 11e. The electron beam 2 having been defined by the fifth aperture mask pattern 11e of the first aperture member 6 is therefore irradiated onto the resist over the wafer "W" thereby to write the fifth type unit pattern P5 on the resist.

In a seventh step S17, if, however, no correspondence of the sixth type unit pattern P6 with any of the above five aperture mask patterns 11a, 11b, 11c, 11d and 11e is confirmed by the data-collator 13, then the deflection-controller 14 controls the deflection to allow that the electron beam 2 having passed through the first square-shaped aperture 10 is transmitted toward the square-shaped second aperture 10 of the second aperture member 6, whereby the electron beam 2 is shaped by a combination of the first and second apertures 10 and 9 in accordance with the same function as the normal variable shaped electron beam exposure system, for example, by a relative movement of the first and second aperture members 6 and 5.

The above sixth and seventh steps S16 and S17 will continue until all of the divided unit patterns are written to write all of the write-required patterns on the resist.

In accordance with the above present invention, a total number of the unit patterns divided from the six write-required patterns is remarkably reduced to seventeen, whilst the conventional system divides the six write-required patterns into thirty three unit patterns. This remarkable reduction in the total number of the unit patterns results in a remarkable reduction in the number of the processes of the electron beam lithography. The remarkable reduction in the number of the processes of the electron beam lithography further results in a remarkable improvement in throughput. Further, the remarkable reduction in the number of the processes of the electron beam lithography also results in a remarkable reduction in the necessary time for the electron beam lithography. In addition, the remarkable reduction in the total number of the unit patterns results in a reduction in error of sizes of the final patterns written by the above novel variable shaped electron beam exposure. This means that an accuracy in size of the final patterns written by the above novel variable shaped electron beam exposure is remarkably improved.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A controller in a variable shaped electron beam exposure system, said controller being connected to a deflector for controlling a deflection by said deflector to an electron beam on a transmission between first and second aperture members positioned to have a distance along which said electron beam is transmitted, and said first and second aperture members having first and second apertures for shaping said electron beam so that said electron beam is first transmitted through said first aperture member and then transmitted through said second aperture member, and said second aperture member further having at least one aperture mask pattern with a shape different from a shape of said second aperture and said at least one aperture mask pattern also having a smaller size than said first aperture, wherein said controller includes:
  a first means being connected to a first memory for reading data of write-required patterns out of said first memory to divide each of said write-required patterns into a plurality of unit patterns; and
  a second means being connected to said first means for fetching said unit patterns and also connected to a second memory for reading out data of said shape of said at least one aperture mask pattern so as to collate said unit patterns with said shape of said at least one aperture mask pattern to confirm any correspondence between said unit patterns and said shape of said at least one aperture mask pattern,
  so that if said correspondence between said unit patterns and said shape of said at least one aperture mask pattern is confirmed, then said controller controls said deflection to allow said electron beam to be transmitted toward said at least one aperture mask pattern of said second aperture member whereby said electron beam is shaped in accordance with said shape of said at least one aperture mask pattern, and so that if no correspondence between said unit patterns and said shape of said at least one aperture mask pattern is confirmed, then said controller controls said deflection to allow said electron beam to be transmitted toward said second aperture whereby said electron beam is shaped by a combination of said first and second apertures for said variable shaped electron beam exposure.

2. The controller in said variable shaped electron beam exposure system as claimed in claim 1, wherein said second aperture member has a set of plural aperture mask patterns differing in shape from each other, and said second means collates said unit patterns with said shapes of said plural aperture mask patterns to confirm any correspondence between said unit patterns and said shapes of said plural aperture mask patterns, so that if any correspondence between said unit patterns and any of said shapes of said plural aperture mask patterns is confirmed, then said controller controls said deflection to allow said electron beam to be transmitted toward a corresponding one of said plural aperture mask patterns of said second aperture member whereby said electron beam is shaped in accordance with said shape of said corresponding one of said plural aperture mask patterns, and so that if no correspondence between said unit patterns and any of said shapes of said plural aperture mask patterns is confirmed, then said controller controls said deflection to allow said electron beam to be transmitted toward said second aperture whereby said electron beam is shaped by a combination of said first and second apertures for said variable shaped electron beam exposure.

3. The controller in said variable shaped electron beam exposure system as claimed in claim 2, wherein said second aperture is positioned at a center of said second aperture member and said plural aperture mask patterns are positioned around said second aperture.

4. A controller in a variable shaped electron beam exposure system, said controller being connected to a deflector for controlling a deflection by said deflector to an electron beam on a transmission between first and second aperture members positioned to have a distance along which said electron beam is transmitted, and said first and second aperture members having first and second apertures for shaping said electron beam so that said electron beam is first transmitted through said first aperture member and then transmitted through said second aperture member, and said first aperture member further having at least one aperture mask pattern with a shape different from a shape of said first aperture and said at least one aperture mask pattern also having a smaller size than said second aperture, wherein said controller includes:

a first means being connected to a first memory for reading data of write-required patterns out of said first memory to divide each of said write-required patterns into a plurality of unit patterns; and a second means being connected to said first means for fetching said unit patterns and also connected to a second memory for reading out data of said shape of said at least one aperture mask pattern so as to collate said unit patterns with said shape of said at least one aperture mask pattern to confirm any correspondence between said unit patterns and said shape of said at least one aperture mask pattern, so that if said correspondence between said unit patterns and said shape of said at least one aperture mask pattern is confirmed, then said controller controls said deflection to allow that said electron beam penetrated through and shaped by said at least one aperture mask pattern is passed through said second aperture whereby said electron beam is shaped in accordance with said shape of said at least one aperture mask pattern, and so that if no correspondence between said unit patterns and said shape of said at least one aperture mask pattern is confirmed, then said controller controls said deflection to allow that said electron beam penetrated through and shaped by said first aperture is transmitted toward said second aperture where by said electron beam is shaped by a combination of said first and second apertures for said variable shaped electron beam exposure.

5. The controller in said variable shaped electron beam exposure system as claimed in claim 4, wherein said first aperture member has a set of plural aperture mask patterns differing in shape from each other, and said second means collates said unit patterns with said shapes of said plural aperture mask patterns to confirm any correspondence between said unit patterns and said shapes of said plural aperture mask patterns, so that if any correspondence between said unit patterns and any of said shapes of said plural aperture mask patterns is confirmed, then said controller controls said deflection to allow that said electron beam penetrated through and shaped by a corresponding one of said plural aperture mask patterns is passed through said second aperture whereby said electron beam is shaped in accordance with said shape of said corresponding one of said plural aperture mask patterns, and so that if no correspondence between said unit patterns and any of said shapes of said plural aperture mask patterns is confirmed, then said controller controls said deflection to allow that said electron beam penetrated through and shaped by said first aperture is passed through said second aperture whereby said electron beam is shaped by a combination of said first and second apertures for said variable shaped electron beam exposure.

6. The controller in said variable shaped electron beam exposure system as claimed in claim 5, wherein said first aperture is positioned at a center of said first aperture member and said plural aperture mask patterns are positioned around said first aperture.

7. A variable shaped electron beam exposure system comprising:

an electron gum for emitting an electron beam;

a pair of first and second aperture members positioned to have a distance in a direction along which said electron beam is transmitted, and said first and second aperture members having first and second apertures for shaping said electron beam so that said electron beam is first transmitted through said first aperture member and then transmitted through said second aperture member, wherein said second aperture member further has at least one aperture mask pattern having a shape different from a shape of said second aperture and said at least one aperture mask pattern has a smaller size than said first aperture;

a deflector positioned between said first and second aperture members for deflecting said electron beam; and a controller being connected to a deflector for controlling a deflection by said deflector to said electron beam on a transmission between first and second aperture members, wherein said controller further includes:

a first means being connected to a first memory for reading data of write-required patterns out of said first memory to divide each of said write-required patterns into a plurality of unit patterns; and a second means being connected to said first means for fetching said unit patterns and also connected to a second memory for reading out data of said shape of said at least one aperture mask pattern so as to collate said unit patterns with said shape of said at least one aperture mask pattern to confirm any correspondence between said unit patterns and said shape of said at least one aperture mask pattern, so that if said correspondence between said unit patterns and said shape of said at least one aperture mask pattern is confirmed, then said controller controls said deflection to allow said electron beam to be transmitted toward said at least one aperture mask pattern of said second aperture member whereby said electron beam is shaped in accordance with said shape of said at least one aperture mask pattern, and so that if no correspondence between said unit patterns and said shape of said at least one aperture mask pattern is confirmed, then said controller controls said deflection to allow said electron beam to be transmitted toward said second aperture where by said electron beam is shaped by a combination of said first and second apertures for said variable shaped electron beam exposure.

8. The variable shaped electron beam exposure system as claimed in claim 7, wherein said second aperture member has a set of plural aperture mask patterns differing in shape from each other, and said second means collates said unit patterns with said shapes of said plural aperture mask patterns to confirm any correspondence between said unit patterns and said shapes of said plural aperture mask patterns, so that if any correspondence between said unit patterns and any of said shapes of said plural aperture mask patterns is confirmed, then said controller controls said deflection to allow said electron beam to be transmitted toward a corresponding one of said plural aperture mask patterns of said second aperture member whereby said electron beam is shaped in accordance with said shape of said corresponding one of said plural aperture mask patterns, and so that if no correspondence between said unit patterns and any of said shapes of said plural aperture mask patterns is confirmed, then said controller controls said deflection to allow said electron beam to be transmitted toward said second aperture whereby said electron beam is shaped by a combination of said first and second apertures for said variable shaped electron beam exposure.

9. The variable shaped electron beam exposure system as claimed in claim 8, wherein said second aperture is positioned at a center of said second aperture member and said plural aperture mask patterns are positioned around said second aperture.

10. A variable shaped electron beam exposure system comprising:

an electron gum for emitting an electron beam;

a pair of first and second aperture members positioned to have a distance in a direction along which an electron beam is transmitted, and said first and second aperture members having first and second apertures for shaping said electron beam so that said electron beam is first transmitted through said first aperture member and then transmitted through said second aperture member, wherein said first aperture member further has at least one aperture mask pattern having a shape different from a shape of said first aperture and said at least one aperture mask pattern has a smaller size than said second aperture;

a deflector positioned between said first and second aperture members for deflecting said electron beam; and a controller being connected to said deflector for controlling a deflection by said deflector to said electron beam on a transmission between first and second aperture members, wherein said controller includes:

a first means being connected to a first memory for reading data of write-required patterns out of said first memory to divide each of said write-required patterns into a plurality of unit patterns; and a second means being connected to said first means for fetching said unit patterns and also connected to a second memory for reading out data of said shape of said at least one aperture mask pattern so as to collate said unit patterns with said shape of said at least one aperture mask pattern to confirm any correspondence between said unit patterns and said shape of said at least one aperture mask pattern, so that if said correspondence between said unit patterns and said shape of said at least one aperture mask pattern is confirmed, then said controller controls said deflection to allow that said electron beam penetrated through and shaped by said at least one aperture mask pattern is passed through said second aperture whereby said electron beam is shaped in accordance with said shape of said at least one aperture mask pattern, and so that if no correspondence between said unit patterns and said shape of said at least one aperture mask pattern is confirmed, then said controller controls said deflection to allow that said electron beam penetrated through and shaped by said first aperture is transmitted toward said second aperture whereby said electron beam is shaped by a combination of said first and second apertures for said variable shaped electron beam exposure.

11. The variable shaped electron beam exposure system as claimed in claim 10, wherein said first aperture member has a set of plural aperture mask patterns differing in shape from each other, and said second means collates said unit patterns with said shapes of said plural aperture mask patterns to confirm any correspondence between said unit patterns and said shapes of said plural aperture mask patterns, so that if any correspondence between said unit patterns and any of said shapes of said plural aperture mask patterns is confirmed, then said controller controls said deflection to allow that said electron beam penetrated through and shaped by a corresponding one of said plural aperture mask patterns is passed through said second aperture whereby said electron beam is shaped in accordance with said shape of said corresponding one of said plural aperture mask patterns, and so that if no correspondence between said unit patterns and any of said shapes of said plural aperture mask patterns is confirmed, then said controller controls said deflection to allow that said electron beam penetrated through and shaped by said first aperture is passed through said second aperture whereby said electron beam is shaped by a combination of said first and second apertures for said variable shaped electron beam exposure.

12. The variable shaped electron beam exposure system as claimed in claim 11, wherein said first aperture is positioned at a center of said first aperture member and said plural aperture mask patterns are positioned around said first aperture.

13. A computer-readable storage medium for storing a computer program for controlling a deflection of an electron beam by a deflector provided in a variable shaped electron beam exposure system, said deflection being made to said electron beam on a transmission between first and second aperture members positioned to have a distance along which said electron beam is transmitted, and said first and second aperture members having first and second apertures for shaping said electron beam so that said electron beam is first transmitted through said first aperture member and then transmitted through said second aperture member, and said second aperture member further having at least one aperture mask pattern with a shape different from a shape of said second aperture and said at least one aperture mask pattern also having a smaller size than said first aperture, wherein said computer program includes the steps of:

reading out data of write-required patterns to divide each of said write-required patterns into a plurality of unit patterns;

fetching said unit patterns and reading out data of said shape of said at least one aperture mask pattern; and collating said unit patterns with said shape of said at least one aperture mask pattern to confirm any correspondence between said unit patterns and said shape of said at least one aperture mask pattern, so that if said correspondence between said unit patterns and said shape of said at least one aperture mask pattern is confirmed, then said deflection is controlled to allow said electron beam to be transmitted toward said at least one aperture mask pattern of said second aperture member whereby said electron beam is shaped in accordance with said shape of said at least one aperture mask pattern, and so that if no correspondence between said unit patterns and said shape of said at least one aperture mask pattern is confirmed, then said deflection is controlled to allow said electron beam to be transmitted toward said second aperture whereby said electron beam is shaped by a combination of said first and second apertures for said variable shaped electron beam exposure.

14. The computer-readable storage medium as claimed in claim 13, wherein said second aperture member has a set of plural aperture mask patterns differing in shape from each other, and said third step collates said unit patterns with said shapes of said plural aperture mask patterns to confirm any correspondence between said unit patterns and said shapes of said plural aperture mask patterns, so that if any correspondence between said unit patterns and any of said shapes of said plural aperture mask patterns is confirmed, then said deflection is controlled to allow said electron beam to be transmitted toward a corresponding one of said plural aperture mask patterns of said second aperture member whereby said electron beam is shaped in accordance with said shape of said corresponding one of said plural aperture mask patterns, and so that if no correspondence between said unit patterns and any of said shapes of said plural aperture mask patterns is confirmed, then said deflection is controlled to allow said electron beam to be transmitted toward said second aperture whereby said electron beam is shaped by a combination of said first and second apertures for said variable shaped electron beam exposure.

15. The computer-readable storage medium as claimed in claim 13, wherein all of said unit patterns divided from all of said write-required patterns have been collated with said shape of said at least one aperture mask pattern to confirm any correspondence between said unit patterns and said shape of said at least one aperture mask pattern before said variable shaped electron beam exposures are conducted to said all of said unit patterns.

16. The computer-readable storage medium as claimed in claim 13, wherein a set of said third collation step and subsequent variable shaped electron beam exposure is sequentially conducted to each of said unit patterns divided from all of said write-required patterns.

17. A computer-readable storage medium for storing a computer program for controlling a deflection of an electron beam by a deflector provided in a variable shaped electron beam exposure system, said deflection being made to said electron beam on a transmission between first and second aperture members positioned to have a distance along which said electron beam is transmitted, and said first and second aperture members having first and second apertures for shaping said electron beam so that said electron beam is first transmitted through said first aperture member and then transmitted through said second aperture member and said first aperture member further having at least one aperture mask pattern with a shape different from a shape of said first aperture and said at least one aperture mask pattern also having a smaller size than said second aperture, wherein said computer program includes the steps of:

reading out data of write-required patterns to divide each of said write-required patterns into a plurality of unit patterns;

fetching said unit patterns and reading out data of said shape of said at least one aperture mask pattern; and collating said unit patterns with said shape of said at least one aperture mask pattern to confirm any correspondence between said unit patterns and said shape of said at least one aperture mask pattern, so that if said correspondence between said unit patterns and said shape of said at least one aperture mask pattern is confirmed, then said deflection is controlled to allow that said electron beam penetrated through and shaped by said at least one aperture mask pattern is passed through said second aperture whereby said electron beam is shaped in accordance with said shape of said at least one aperture mask pattern, and so that if no correspondence between said unit patterns and said shape of said at least one aperture mask pattern is confirmed, then said deflection is controlled to allow that said electron beam penetrated through and shaped by said first aperture is transmitted toward said second aperture whereby said electron beam is shaped by a combination of said first and second apertures for said variable shaped electron beam exposure.

18. The computer-readable storage medium as claimed in claim 17, wherein said first aperture member has a set of plural aperture mask patterns differing in shape from each other, and said third step collates said unit patterns with said shapes of said plural aperture mask patterns to confirm any correspondence between said unit patterns and said shapes of said plural aperture mask patterns, so that if any correspondence between said unit patterns and any of said shapes of said plural aperture mask patterns is confirmed, then said deflection is controlled to allow that said electron beam penetrated through and shaped by a corresponding one of said plural aperture mask patterns is passed through said second aperture whereby said electron beam is shaped in accordance with said shape of said corresponding one of said plural aperture mask patterns, and so that if no correspondence between said unit patterns and any of said shapes of said plural aperture mask patterns is confirmed, then said deflection is controlled to allow that said electron beam penetrated through and shaped by said first aperture is passed through said second aperture whereby said electron beam is shaped by a combination of said first and second apertures for said variable shaped electron beam exposure.

19. The computer-readable storage medium as claimed in claim 17, wherein all of said unit patterns divided from all of said write-required patterns have been collated with said shape of said at least one aperture mask pattern to confirm any correspondence between said unit patterns and said shape of said at least one aperture mask pattern before said variable shaped electron beam exposures are conducted to said all of said unit patterns.

20. The computer-readable storage medium as claimed in claim 17, wherein a set of said third collation step and subsequent variable shaped electron beam exposure is sequentially conducted to each of said unit patterns divided from all of said write-required patterns.

21. A method of controlling a deflection of an electron beam by a deflector provided in a variable shaped electron beam exposure system, said deflection being made to said electron beam on a transmission between first and second aperture members positioned to have a distance along which said electron beam is transmitted, and said first and second aperture members having first and second apertures for shaping said electron beam so that said electron beam is first transmitted through said first aperture member and then transmitted through said second aperture member, and said second aperture member further having at least one aperture mask pattern with a shape different from a shape of said second aperture and said at least one aperture mask pattern also having a smaller size than said first aperture, wherein said method includes the steps of:

reading out data of write-required patterns to divide each of said write-required patterns into a plurality of unit patterns;

fetching said unit patterns and reading out data of said shape of said at least one aperture mask pattern; and collating said unit patterns with said shape of said at least one aperture mask pattern to confirm any correspondence between said unit patterns and said shape of said at least one aperture mask pattern, so that if said correspondence between said unit patterns and said shape of said at least one aperture mask pattern is confirmed, then said deflection is controlled to allow said electron beam to be transmitted toward said at least one aperture mask pattern of said second aperture member whereby said electron beam is shaped in accordance with said shape of said at least one aperture mask pattern, and so that if no correspondence between said unit patterns and said shape of said at least one aperture mask pattern is confirmed, then said deflection is controlled to allow said electron beam to be transmitted toward said second aperture whereby said electron beam is shaped by a combination of said first and second apertures for said variable shaped electron beam exposure.

22. The method as claimed in claim 21, wherein said second aperture member has a set of plural aperture mask patterns differing in shape from each other, and said third step collates said unit patterns with said shapes of said plural aperture mask patterns to confirm any correspondence between said unit patterns and said shapes of said plural aperture mask patterns, so that if any correspondence between said unit patterns and any of said shapes of said plural aperture mask patterns is confirmed, then said deflection is controlled to allow said electron beam to be transmitted toward a corresponding one of said plural aperture mask patterns of said second aperture member whereby said electron beam is shaped in accordance with said shape of said corresponding one of said plural aperture mask patterns, and so that if no correspondence between said unit patterns and any of said shapes of said plural aperture mask patterns is confirmed, then said deflection is controlled to allow said electron beam to be transmitted toward said second aperture whereby said electron beam is shaped by a combination of said first and second apertures for said variable shaped electron beam exposure.

23. The method as claimed in claim 21, wherein all of said unit patterns divided from all of said write-required patterns have been collated with said shape of said at least one aperture mask pattern to confirm any correspondence between said unit patterns and said shape of said at least one aperture mask pattern before said variable shaped electron beam exposures are conducted to said all of said unit patterns.

24. The method as claimed in claim 21, wherein a set of said third collation step and subsequent variable shaped electron beam exposure is sequentially conducted to each of said unit patterns divided from all of said write-required patterns.

25. A method of controlling a deflection of an electron beam by a deflector provided in a variable shaped electron beam exposure system, said deflection being made to said electron beam on a transmission between first and second aperture members positioned to have a distance along which said electron beam is transmitted, and said first and second aperture members having first and second apertures for shaping said electron beam so that said electron beam is first transmitted through said first aperture member and then transmitted through said second aperture member, and said first aperture member further having at least one aperture mask pattern with a shape different from a shape of said first aperture and said at least one aperture mask pattern also having a smaller size than said second aperture, wherein said method includes the steps of:

reading out data of write-required patterns to divide each of said write-required patterns into a plurality of unit patterns;

fetching said unit patterns and reading out data of said shape of said at least one aperture mask pattern; and collating said unit patterns with said shape of said at least one aperture mask pattern to confirm any correspondence between said unit patterns and said shape of said at least one aperture mask pattern, so that if said correspondence between said unit patterns and said shape of said at least one aperture mask pattern is confirmed, then said deflection is controlled to allow that said electron beam penetrated through and shaped by said at least one aperture mask pattern is passed through said second aperture whereby said election beam is shaped in accordance with said shape of said at least one aperture mask pattern, and so that if no correspondence between said unit patterns and said shape of said at least one aperture mask pattern is confirmed, then said deflection is controlled to allow that said electron beam penetrated through and shaped by said first aperture is transmitted toward said second aperture whereby said electron beam is shaped by a combination of said first and second apertures for said variable shaped electron beam exposure.

26. The method as claimed in claim 25, wherein said first aperture member has a set of plural aperture mask patterns differing in shape from each other, and said third step collates said unit patterns with said shapes of said plural aperture mask patterns to confirm any correspondence between said unit patterns and said shapes of said plural aperture mask patterns, so that if any correspondence between said unit patterns and any of said shapes of said plural aperture mask patterns is confirmed, then said deflection is controlled to allow that said electron beam penetrated through and shaped by a corresponding one of said plural aperture mask patterns is passed through said second aperture whereby said electron beam is shaped in accordance with said shape of said corresponding one of said plural aperture mask patterns, and so that if no correspondence between said unit patterns and any of said shapes of said plural aperture mask patterns is confirmed, then said deflection is controlled to allow that said electron beam penetrated through and shaped by said first aperture is passed through said second aperture whereby said electron beam is shaped by a combination of said first and second apertures for said variable shaped electron beam exposure.

27. The method as claimed in claim 25, wherein all of said unit patterns divided from all of said write-required patterns have been collated with said shape of said at least one aperture mask pattern to confirm any correspondence between said unit patterns and said shape of said at least one aperture mask pattern before said variable shaped electron beam exposures are conducted to said all of said unit patterns.

28. The method as claimed in claim 25, wherein a set of said third collation step and subsequent variable shaped electron beam exposure is sequentially conducted to each of said unit patterns divided from all of said write-required patterns.

* * * * *